United States Patent
Nishihara

(10) Patent No.: US 8,969,998 B2
(45) Date of Patent: Mar. 3, 2015

(54) NAND TYPE NONVOLATILE SEMICONDUCTOR MEMORY DEVICE AND METHOD FOR MANUFACTURING SAME

(75) Inventor: Kiyohito Nishihara, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 13/225,743

(22) Filed: Sep. 6, 2011

(65) Prior Publication Data

US 2012/0211861 A1 Aug. 23, 2012

(30) Foreign Application Priority Data

Feb. 23, 2011 (JP) .................... 2011-037223

(51) Int. Cl.
| | | |
|---|---|---|
| H01L 21/70 | (2006.01) | |
| H01L 27/115 | (2006.01) | |
| H01L 21/762 | (2006.01) | |
| H01L 23/485 | (2006.01) | |

(52) U.S. Cl.
CPC .... *H01L 27/11524* (2013.01); *H01L 21/76229* (2013.01); *H01L 23/485* (2013.01); *H01L 2924/0002* (2013.01)
USPC ............ 257/506; 257/E21.553; 257/E21.319; 257/E21.64; 257/E21.167; 257/E21.235

(58) Field of Classification Search
CPC .... H01L 21/762; H01L 21/768; H01L 27/115
USPC ...................... 257/E21.553, E21.319, E21.64, 257/E21.167, E21.235
See application file for complete search history.

(56) References Cited

U.S. PATENT DOCUMENTS

| | | | | |
|---|---|---|---|---|
| 7,745,884 | B2* | 6/2010 | Sato et al. ..................... | 257/390 |
| 7,928,516 | B2* | 4/2011 | Nishihara ..................... | 257/390 |
| 2001/0023991 | A1* | 9/2001 | Kakuhara ..................... | 257/774 |
| 2003/0062522 | A1* | 4/2003 | Yamazaki et al. ............. | 257/49 |
| 2005/0077570 | A1* | 4/2005 | Nishinohara ................. | 257/336 |
| 2006/0038218 | A1* | 2/2006 | Yaegashi et al. .............. | 257/314 |
| 2006/0043464 | A1* | 3/2006 | Tsunoda et al. .............. | 257/316 |
| 2006/0091482 | A1* | 5/2006 | Kim et al. ..................... | 257/401 |
| 2006/0237723 | A1* | 10/2006 | Ito ................................. | 257/59 |
| 2007/0002622 | A1* | 1/2007 | Matsunaga et al. ...... | 365/185.11 |
| 2007/0102749 | A1* | 5/2007 | Shirota et al. ................ | 257/314 |
| 2007/0122971 | A1* | 5/2007 | Dobuzinsky et al. ......... | 438/257 |
| 2008/0212373 | A1* | 9/2008 | Hasegawa et al. ....... | 365/185.17 |
| 2008/0265365 | A1* | 10/2008 | Frohberg et al. ............. | 257/513 |
| 2009/0101969 | A1* | 4/2009 | Katsumata et al. .......... | 257/329 |

(Continued)

FOREIGN PATENT DOCUMENTS

JP 2009-54941 3/2009

*Primary Examiner* — Caleb Henry
(74) *Attorney, Agent, or Firm* — Oblon, McClelland, Maier & Neustadt, L.L.P.

(57) ABSTRACT

According to one embodiment, a semiconductor memory device includes a semiconductor substrate, a plurality of element-separating insulators, and contacts. The plurality of element-separating insulators partition the upper layer portion into a plurality of active areas extending in a first direction. The contacts are connected to the active areas. A recess is made in a part in the first direction of an upper surface of each of the active areas. The recess is made across the entire active area in a second direction orthogonal to the first direction. Positions in the first direction of two of the contacts connected respectively to mutually-adjacent active areas are different from each other. One of the contacts is in contact with a side surface of the recess and not in contact with a bottom surface of the recess.

10 Claims, 26 Drawing Sheets

(56) References Cited

U.S. PATENT DOCUMENTS

| | | | |
|---|---|---|---|
| 2010/0072542 A1* | 3/2010 | Kadoya et al. | 257/330 |
| 2010/0155791 A1* | 6/2010 | Yamada | 257/288 |
| 2010/0155813 A1* | 6/2010 | Murata et al. | 257/316 |
| 2010/0155832 A1* | 6/2010 | Im | 257/330 |
| 2010/0181640 A1* | 7/2010 | Shiromoto et al. | 257/506 |
| 2010/0200948 A1* | 8/2010 | Kim | 257/520 |
| 2011/0003459 A1* | 1/2011 | Shin et al. | 438/430 |
| 2011/0049604 A1 | 3/2011 | Nishihara | |
| 2011/0079851 A1* | 4/2011 | Li et al. | 257/347 |
| 2011/0195551 A1* | 8/2011 | Kim | 438/238 |

* cited by examiner

C-C' CROSS SECTION

D-D' CROSS SECTION

E-E' CROSS SECTION

D-D' CROSS SECTION

E-E' CROSS SECTION

D-D' CROSS SECTION

E-E' CROSS SECTION

D-D' CROSS SECTION

E-E' CROSS SECTION

D-D' CROSS SECTION

E-E' CROSS SECTION

D-D' CROSS SECTION

E-E' CROSS SECTION

D-D' CROSS SECTION

E-E' CROSS SECTION

D-D' CROSS SECTION

E-E' CROSS SECTION

D-D′ CROSS SECTION

E-E′ CROSS SECTION

D-D'
CROSS SECTION

E-E'
CROSS SECTION

D-D'
CROSS SECTION

E-E'
CROSS SECTION

D-D'
CROSS SECTION

E-E'
CROSS SECTION

D-D' CROSS SECTION

E-E' CROSS SECTION

NAND TYPE NONVOLATILE SEMICONDUCTOR MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2011-037223, filed on Feb. 23, 2011; the entire contents of which are incorporated herein by reference.

FIELD

Embodiments described herein relate generally to a semiconductor memory device and a method for manufacturing the same.

BACKGROUND

Conventionally, NAND memory devices have been used as nonvolatile semiconductor memory devices. In a NAND memory device, the upper layer portion of the silicon substrate is partitioned into multiple portions having line configurations; and these portions having line configurations are used as active areas. Multiple memory cells are formed in each of the active areas; and a pair of selection gate electrodes is provided on two sides of the multiple memory cells respectively. A bit line and a source line are provided above the silicon substrate and are connected to the pair of selection gate electrodes on the two sides. At this time, at least the bit line is connected to the active area via a contact.

However, the short margin between mutually-adjacent contacts undesirably decreases as downscaling of the NAND memory device progresses. For example, in the case where the contact diameter enlarges excessively due to the fluctuation of the manufacturing processes, there is a risk that two of the contacts connected to mutually-adjacent active areas may undesirably short to each other. Therefore, technology has been proposed to arrange the contacts in a staggered configuration as viewed from above.

However, although the short margin between the contacts can be improved by arranging the contacts in the staggered configuration, the short margin between the contact and the active area is not improved. In other words, there is a risk of the contact connected to one active area being shorted to an active area disposed adjacently to the one active area in the case where the spacing between the active areas is reduced. Therefore, the product yield undesirably decreases when shrinking the NAND memory device.

Although the necessary short margin is reduced if the formation positions of the contacts are controlled with high precision, there is a limitation on increasing the precision of the lithography. Although it is conceivable to make the contacts finer to ensure the short margin, in the case where the contacts are made finer, the contact resistance increases, the cell current decreases, and the difficulty when making the contact holes increases. Therefore, there is a possibility that open defects may increase.

DETAILED DESCRIPTION

In general, according to one embodiment, a semiconductor memory device includes a semiconductor substrate, a plurality of element-separating insulators, and contacts. The plurality of element-separating insulators are formed in an upper layer portion of the semiconductor substrate. The plurality of element-separating insulators partition the upper layer portion into a plurality of active areas extending in a first direction. The contacts are connected to the active areas respectively. A recess is made in a part in the first direction of an upper surface of each of the active areas. The recess is made across the entire active area in a second direction orthogonal to the first direction. Positions in the first direction of two of the contacts connected respectively to mutually-adjacent active areas are different from each other. One of the contacts is in contact with a side surface of the recess and not in contact with a bottom surface of the recess.

According to another embodiment, a method is disclosed for manufacturing a semiconductor memory device. The method can include making a trench in an upper layer portion of a semiconductor substrate to extend in a first direction. The method can include partitioning the upper layer portion into a plurality of active areas by filling an insulating material into the trench. The method can include making a recess in an upper surface of each of the active areas by etching the semiconductor substrate using a mask. An opening is made in the mask to extend in a second direction orthogonal to the first direction. The method can include forming an inter-layer insulating film on the semiconductor substrate. The method can include making contact holes. In addition, the method can include filling a conductive material into the contact holes. The contact holes are formed directly above the active areas in the inter-layer insulating film to reach side surfaces of the recesses and not reach bottom surfaces of the recesses. Positions in the first direction of the contact holes directly above two mutually-adjacent active areas are different from each other.

Various embodiments will be described hereinafter with reference to the accompanying drawings.

First, a first embodiment will be described.

The first embodiment is an embodiment that describes the positional relationship between the active areas and the contacts of a NAND nonvolatile semiconductor memory device. The configuration of the semiconductor memory device and the method for manufacturing the semiconductor memory device are described in detail in a sixth embodiment described below.

Figure 1:
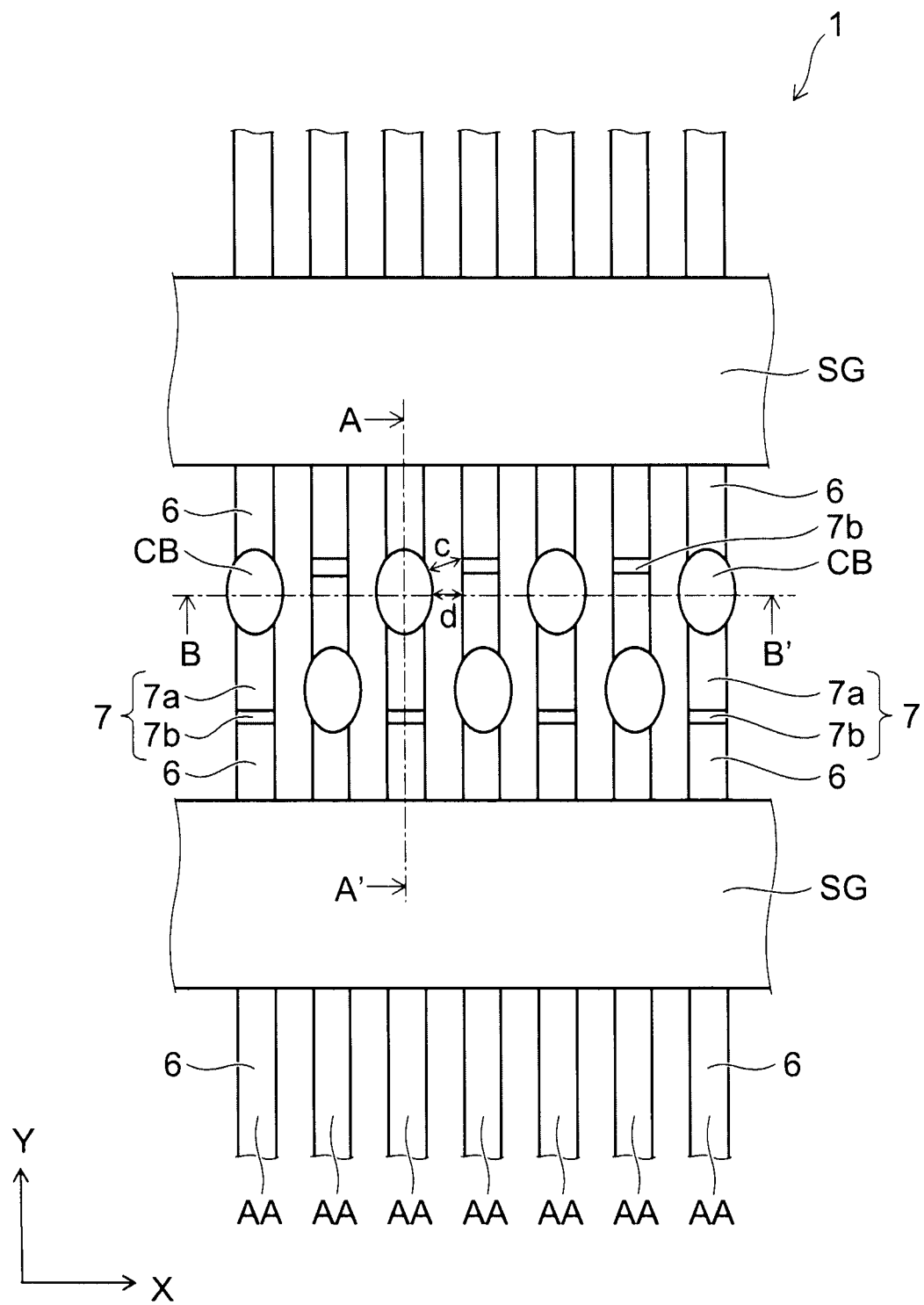
FIG. 1 is a plan view illustrating a semiconductor memory device according to a first embodiment.

FIG. 1 is a plan view illustrating the semiconductor memory device according to the embodiment.

Figure 2:
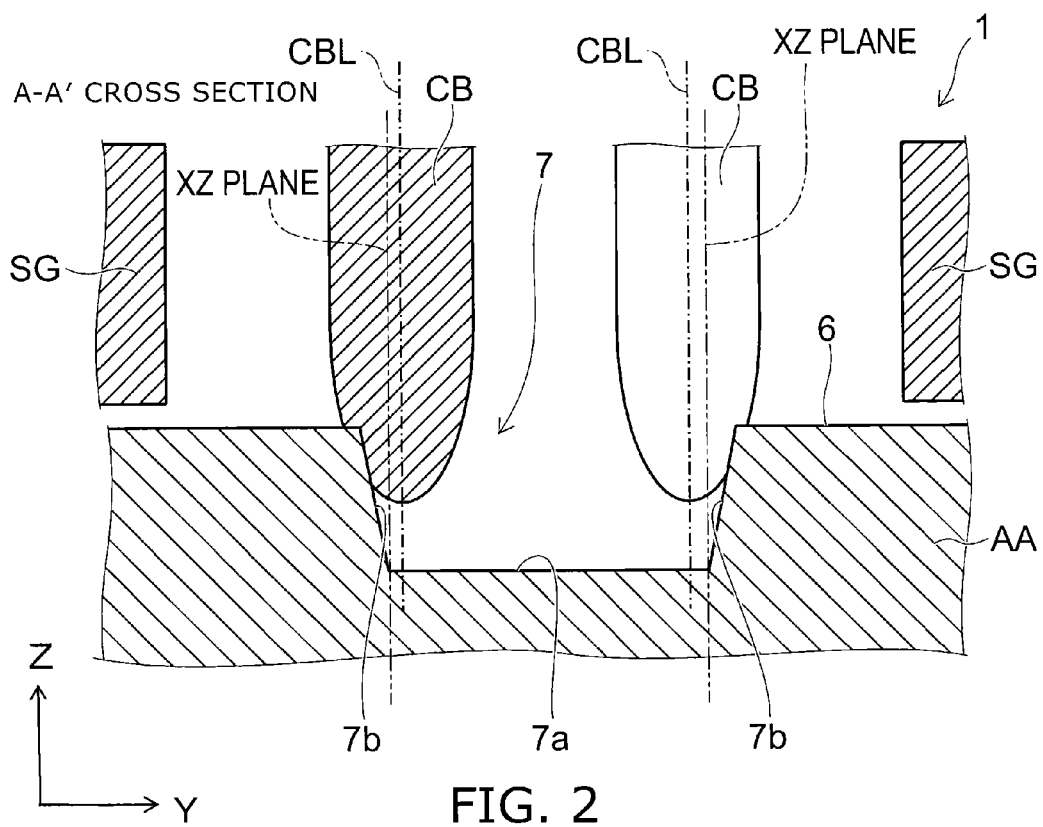
FIG. 2 is a cross-sectional view along line A-A' of FIG. 1.

FIG. 2 is a cross-sectional view along line A-A' of FIG. 1.

Figure 3:
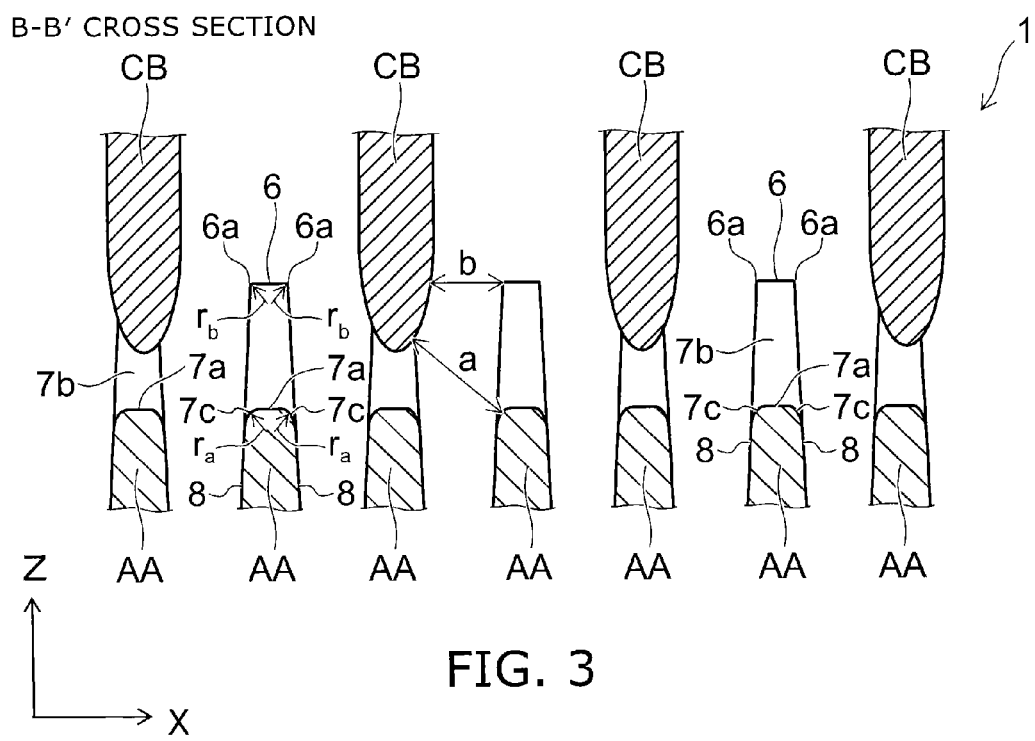
FIG. 3 is a cross-sectional view along line B-B' of FIG. 1.

FIG. 3 is a cross-sectional view along line B-B' of FIG. 1.

In FIG. 1 to FIG. 3, only the conductive portions are illustrated, and the insulating portions are omitted to simplify the drawings. This is similar also for FIG. 4 to FIG. 7 described below.

As illustrated in FIG. 1, the semiconductor memory device 1 according to the embodiment (also referred to hereinbelow as simply the device 1) is a NAND flash memory. A silicon substrate is provided in the device 1; and multiple STIs (not-illustrated shallow trench isolation, i.e., element-separating insulators) extending in one direction are formed in the upper layer portion of the silicon substrate. The upper layer portion of the silicon substrate is partitioned into multiple active areas AA by these STIs.

Hereinbelow, an XYZ orthogonal coordinate system is employed for convenience of description in the specification. Namely, the direction in which the STI and the active area AA extend parallel to the upper surface of the silicon substrate is taken as a Y direction; the arrangement direction of the STI and the active area, i.e., the width direction of the active area, which is parallel to the upper surface of the silicon substrate, is taken as an X direction; and a direction perpendicular to the upper surface of the silicon substrate is taken as a Z direction.

In the device 1, the control gate electrode (not illustrated) extending in the X direction is multiply provided on the silicon substrate. One floating gate electrode (not illustrated) is provided at each portion where the active areas AA overlay the control gate electrodes as viewed from the Z direction. The floating gate electrodes are disposed between the active areas AA and the control gate electrodes. Thereby, a memory cell is provided at each of the most proximal portions between the active areas AA and the control gate electrodes. Multiple memory cells arranged in one column along the active area AA are used to form a memory string.

A pair of selection gate electrodes SG is provided respectively above the silicon substrate on two sides of a group of multiple control gate electrodes. Thereby, selection transistors are provided at the most proximal portions between the active areas AA and the selection gate electrodes SG.

As illustrated in FIG. 1 to FIG. 3, bit lines (not illustrated) extending in the Y direction are provided in the regions directly above the active areas AA. The bit line is connected to the active area AA by a bit line contact CB. In other words, the lower end portion of each of the bit line contacts CB is connected to the active area AA; and the upper end portion is connected to the bit line. Although the central axis of the bit line contact CB is positioned on the center line of the active area AA in the design, there are cases where the central axis of the bit line contact CB undesirably shifts from the center line of the active area AA due to the fluctuation of the manufacturing processes when actually manufacturing the device 1.

In the device 1, recesses 7 are made respectively in the upper surfaces 6 of the active areas AA. For convenience of description, it is taken that the recess 7 is not included in the upper surface 6. The recess 7 is made in a region of a Y-direction portion of the active area AA and is made across the entire region in the width direction of the active area AA (the X direction). In other words, the recess 7 is defined by a bottom surface 7a and two side surfaces 7b positioned respectively on two Y-direction sides as viewed from the bottom surface 7a; and an inter-layer insulating film (not illustrated) is disposed on both X-direction sides of the bottom surface 7a. The side surface 7b is tilted with respect to the perpendicular plane (the XZ plane) such that the length of the upper end portion of the recess 7 in the Y direction is longer than the length of the bottom surface 7a in the Y direction.

The recess 7 is made in one location in each of the active areas AA. In the Y direction, the positions of the recesses 7 made in all of active areas AA are the same. The curvature radius $r_a$ of a corner 7c between the bottom surface 7a of the recess 7 and a side surface 8 of the active area AA facing the X direction is larger than a curvature radius $r_b$ of a corner 6a between the side surface 8 and the upper surface 6. In other words, the corner 7c is rounder than the corner 6a.

The bit line contact CB contacts the side surface 7b of the recess 7 and does not contact the bottom surface 7a. The bit line contact CB may or may not contact the upper surface 6 of the active area AA. A straight line CBL formed by extending the central axis of the bit line contact CB intersects the bottom surface 7a of the recess 7. In other words, the central axis of the bit line contact CB is positioned not in the region directly above the side surface 7b but in the region directly above the bottom surface 7a. One of two bit line contacts CB connected respectively to mutually-adjacent active areas AA contacts one of two side surfaces 7b of the recess 7 separated in the Y direction; and the other of the two bit line contacts CB contacts the other of the two side surfaces 7b. Thereby, the positions of the two bit line contacts CB in the Y direction are different from each other; and the bit line contacts CB are disposed in a staggered configuration as viewed from the Z direction. In FIG. 2 and FIG. 3, the hatched regions illustrate cross sections; and these cross sections are positioned in the same plane. Conversely, the regions without hatching illustrate side surfaces positioned further into the page surface than the hatched regions. For example, the bit line contacts CB without hatching are positioned further into the page surface than the hatched bit line contacts CB.

The bit line contact CB extends in the Z direction. For example, the length of the bit line contact CB in the Y direction is longer than the length in the X direction. For example, the length of the Y-direction central portion of the bit line contact CB in the X direction is longer than the length of both Y-direction end portions in the X direction. The lower end portion of the bit line contact CB is tapered to become finer downward. Therefore, the length of the bit line contact CB in the X direction in an XY cross section including the lower end of the contact surface between the bit line contact CB and the active area AA is shorter than the length of the bit line contact CB in the X direction in an XY cross section including the upper end of the contact surface. The bit line contact CB has, for example, a substantially elliptical columnar configuration in which the lower end portion becomes finer toward the lower end.

A source line (not illustrated) extending in the X direction is provided on the silicon substrate and is connected to the active area AA. The bit line and the source line are connected to the active area AA at positions on the outer sides of a pair of selection gate electrodes SG with the memory string interposed therebetween. In other words, the bit line contact CB is connected to a portion of the active area AA positioned between two of the selection gate electrodes SG belonging to mutually different memory strings. Thereby, the memory string is connected between the bit line and the source line; and a selection transistor is provided at each end of the memory string.

Operational effects of the embodiment will now be described.

In the device 1 according to the embodiment as described above, the bit line contact CB contacts the side surface 7b of the recess 7 made in the upper surface 6 of the active area AA and does not contact the bottom surface 7a. Thereby, in the XZ plane as illustrated in FIG. 3, a distance a from one of the bit line contacts CB to the active area AA adjacent to the active area AA to which the one of the bit line contacts CB is connected is longer than a distance b of the case where the recess 7 is not made in the active area AA. Also, the lower end portion of the bit line contact CB has a tapered configuration; and the length in the X direction at the XY cross section including the lower end of the contact surface between the bit line contact CB and the active area AA is shorter than the length in the X direction at the XY cross section including the upper end of the contact surface. For this reason as well, the distance a is longer than the distance b in the XZ plane.

On the other hand, as illustrated in FIG. 1, the length of the Y-direction central portion of the bit line contact CB in the X direction is longer than the lengths of both Y-direction end portions in the X direction. Thereby, in the XY plane as well, the distance c from the one of the bit line contacts CB to the active area AA adjacent to the active area AA to which the one of the bit line contacts CB is connected is longer than the distance d of the case where the recess 7 is not made in the active area AA.

Thus, the distance between the bit line contact CB and the adjacent active area AA is increased in the XZ plane and in the XY plane by making the recess 7. In other words, a>b and c>d. Therefore, in the embodiment, the shortest distance (also referred to hereinbelow as the shortest AA-CB distance) from one of the bit line contacts CB to the active area AA adjacent to the active area AA to which the one of the bit line contacts CB is connected is longer than the shortest AA-CB distance of the case where the recess 7 is not made. Thereby, the short margin can be increased between the active area AA and the bit line contact CB while maintaining the distance between the active areas AA at a constant and maintaining the diameter of the bit line contact CB at a constant. In other words, the device 1 can have higher integration while ensuring a constant short margin and the conductivity of the contacts.

As an example, the width of the active area AA is 10 to 20 nm; the depth of the recess 7 is 50 nm; the distance between the lower end of the bit line contact CB and the bottom surface 7a of the recess 7 of the active area AA is 10 to 20 nm; and the diameters of the portions of the bit line contact CB other than the lower end portion are 10 to 30 nm. In such a case, in the XZ plane described above, the distance a is about 35 to 45 nm and the distance b is about 5 to 10 nm; and in the XY plane, the distance c is about 8 to 13 nm and the distance d is about 5 to 10 nm. The shortest AA-CB distance of the embodiment is about 8 to 13 nm; and the shortest AA-CB distance of the case where the recess 7 is not made is about 5 to 10 nm.

In the embodiment, the bit line contact CB has, for example, an elliptical columnar configuration; and the length of the bit line contact CB in the Y direction is longer than the length in the X direction. Thereby, the shortest AA-CB distance can be lengthened while reliably bringing the bit line contact CB into contact with the side surface 7b of the recess 7.

In the embodiment, the straight line CBL formed by extending the central axis of the bit line contact CB intersects the bottom surface 7a of the recess 7. Thereby, the bottom surface 7a of the recess 7 of the adjacent active area AA is positioned on the X-direction side of the straight line CBL. As a result, the shortest AA-CB distance can be even longer in the case where the configuration of the bit line contact CB juts mostly in the X direction at the Y-direction central portion as in a substantially circular columnar configuration or a substantially elliptical columnar configuration.

In the embodiment, one of two mutually adjacent bit line contacts CB contacts the side surface 7b of one side of the recess 7; and the other of the two mutually adjacent bit line contacts CB contacts the side surface 7b of the other side of the recess 7. Thereby, the bit line contacts CB can be arranged in a staggered configuration as viewed from the Z direction; and the distance between the bit line contacts CB can be increased. As a result, it is easier to ensure the short margin between the bit line contacts CB.

In the embodiment, the curvature radius $r_a$ of the corner 7c is larger than the curvature radius $r_b$ of the corner 6a. Thereby, the distance a described above can be even larger. As an example, the curvature radius $r_a$ is about 5 nm; and the curvature radius $r_b$ is about 1 nm.

A second embodiment will now be described.

Figure 4:
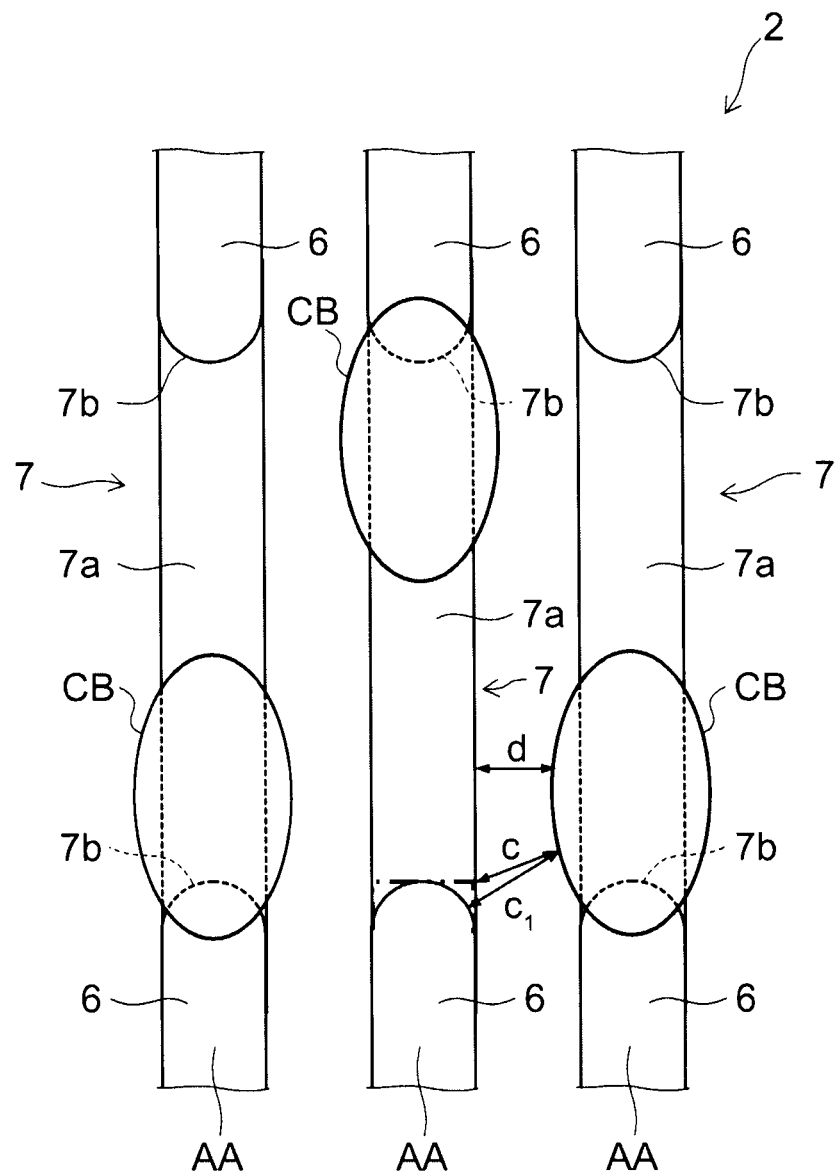
FIG. 4 is a plan view illustrating a semiconductor memory device according to a second embodiment.

FIG. 4 is a plan view illustrating the semiconductor memory device according to the embodiment.

In FIG. 4, only a proximity of the recesses of the active areas is schematically illustrated.

In the semiconductor memory device 2 according to the embodiment as illustrated in FIG. 4, the side surface 7b of the recess 7 is curved to be convex toward the interior of the recess 7 as viewed from the Z direction. In other words, the width-direction (the X-direction) central portion of the side surface 7b juts further toward the interior of the recess 7 than do the two end portions.

Thereby, as illustrated in FIG. 4, a distance $c_1$ of the XY plane can be longer than the distance c of the first embodiment described above. As a result, compared to the first embodiment described above, the shortest AA-CB distance can be even longer and the short margin between the active area AA and the bit line contact CB can be even larger in the embodiment. The contact surface area between the bit line contact CB and the side surface 7b increases by the side surface 7b being curved. Thereby, the resistance between the bit line contact CB and the active area AA (also referred to hereinbelow as simply the contact resistance) can be reduced. Otherwise, the configuration and the operational effects of the embodiment are similar to those of the first embodiment described above.

A third embodiment will now be described.

Figure 5:
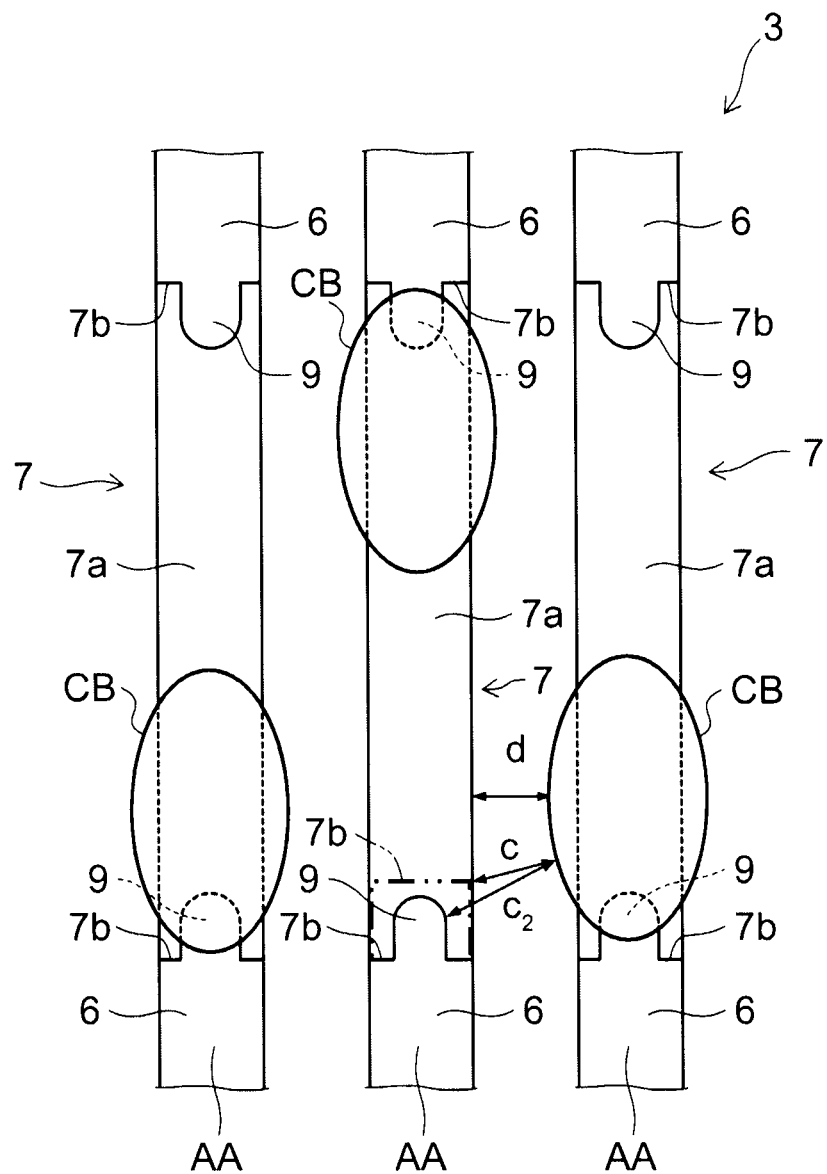
FIG. 5 is a plan view illustrating a semiconductor memory device according to a third embodiment.

FIG. 5 is a plan view illustrating the semiconductor memory device according to the embodiment.

In FIG. 5, only a proximity of the recesses of the active areas is schematically illustrated.

In the semiconductor memory device 3 according to the embodiment as illustrated in FIG. 5, a protruding portion 9 protruding toward the interior of the recess 7 is formed in the X-direction central portion of the side surface 7b of the recess 7 of the active area AA. The width, i.e., the length in the X direction, of the protruding portion 9 is finer than the width of the entire active area AA.

Thereby, as illustrated in FIG. 5, the contact resistance can be reduced even further by causing the protruding portion 9 to stick into the bit line contact CB. Also, a distance $c_2$ of the XY plane can be longer than the distance c of the first embodiment described above. As a result, compared to the first embodiment described above, the shortest AA-CB distance can be longer and the short margin can be even larger in the embodiment. In addition to contacting the protruding portion 9, the bit line contact CB also may contact portions of the side surface 7b of the recess 7 other than the protruding portion 9. Otherwise, the configuration and the operational effects of the embodiment are similar to those of the first embodiment described above.

A fourth embodiment will now be described.

Figure 6A:
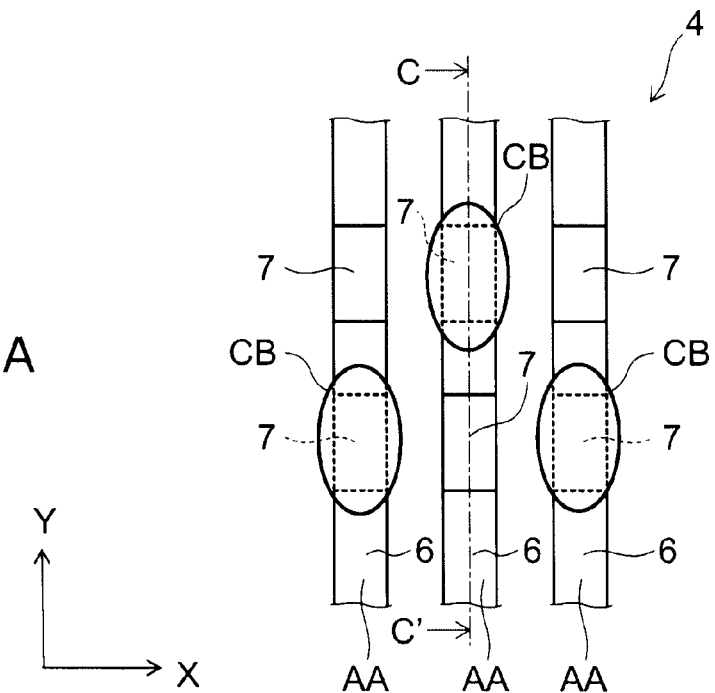
FIG. 6A is a plan view illustrating a semiconductor memory device according to a fourth embodiment.
Figure 6B:
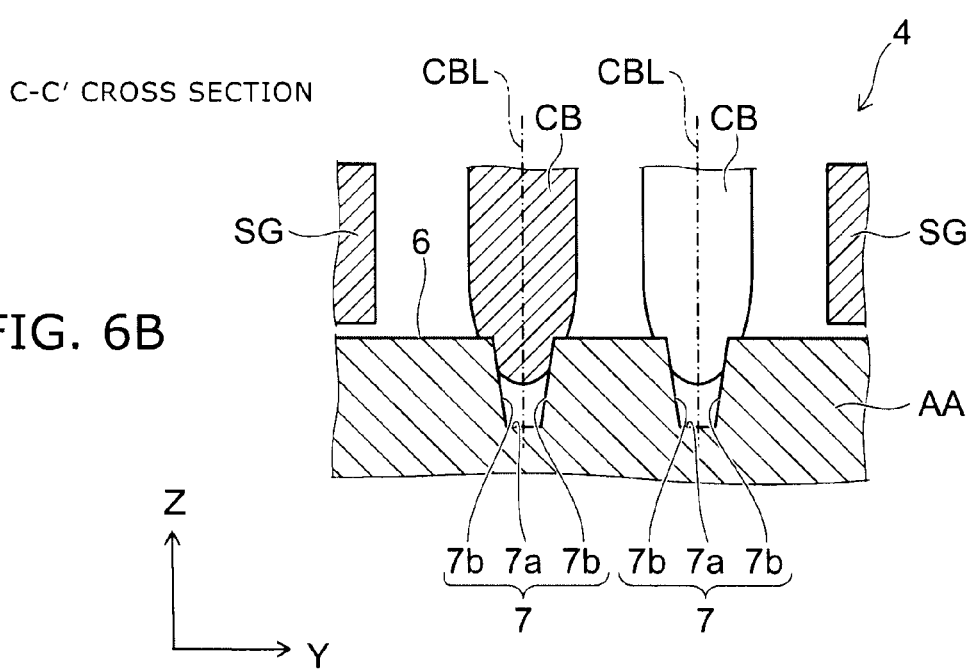
FIG. 6B is a cross-sectional view along line C-C' of FIG. 6A.

FIG. 6A is a plan view illustrating the semiconductor memory device according to the embodiment. FIG. 6B is a cross-sectional view along line C-C' of FIG. 6A.

In FIGS. 6A and 6B, only a proximity of the recesses of the active areas is schematically illustrated. In FIG. 6B, the bit line contacts CB without hatching are positioned further into the page surface than the hatched bit line contacts CB.

In the semiconductor memory device 4 according to the embodiment as illustrated in FIGS. 6A and 6B, the recesses 7 are made in regions in two mutually-separated Y-direction locations in each of the active areas AA. Two bit line contacts CB connected to two mutually-adjacent active areas AA are in contact with recesses 7 having mutually different Y-direction positions. Each of the bit line contacts CB contacts both of the two side surfaces 7b of the recess 7. Similarly to the first embodiment described above, the bit line contact CB does not contact the bottom surface 7a of the recess 7.

According to the embodiment, each of the bit line contacts CB can contact the two side surfaces 7b and the contact resistance can be reduced while ensuring the distance between the bit line contacts CB by disposing the bit line contacts CB in a staggered configuration. Otherwise, the configuration and the operational effects of the embodiment are similar to those of the first embodiment described above.

The recesses 7 may be made in regions in three or more mutually-separated Y-direction locations in each of the active areas AA. Thereby, the Y-direction positions of the bit line contacts CB can be changed periodically by continuously disposing the three or more active areas AA as a basic unit; and the distance between the bit line contacts CB can be increased.

A fifth embodiment will now be described.

Figure 7:
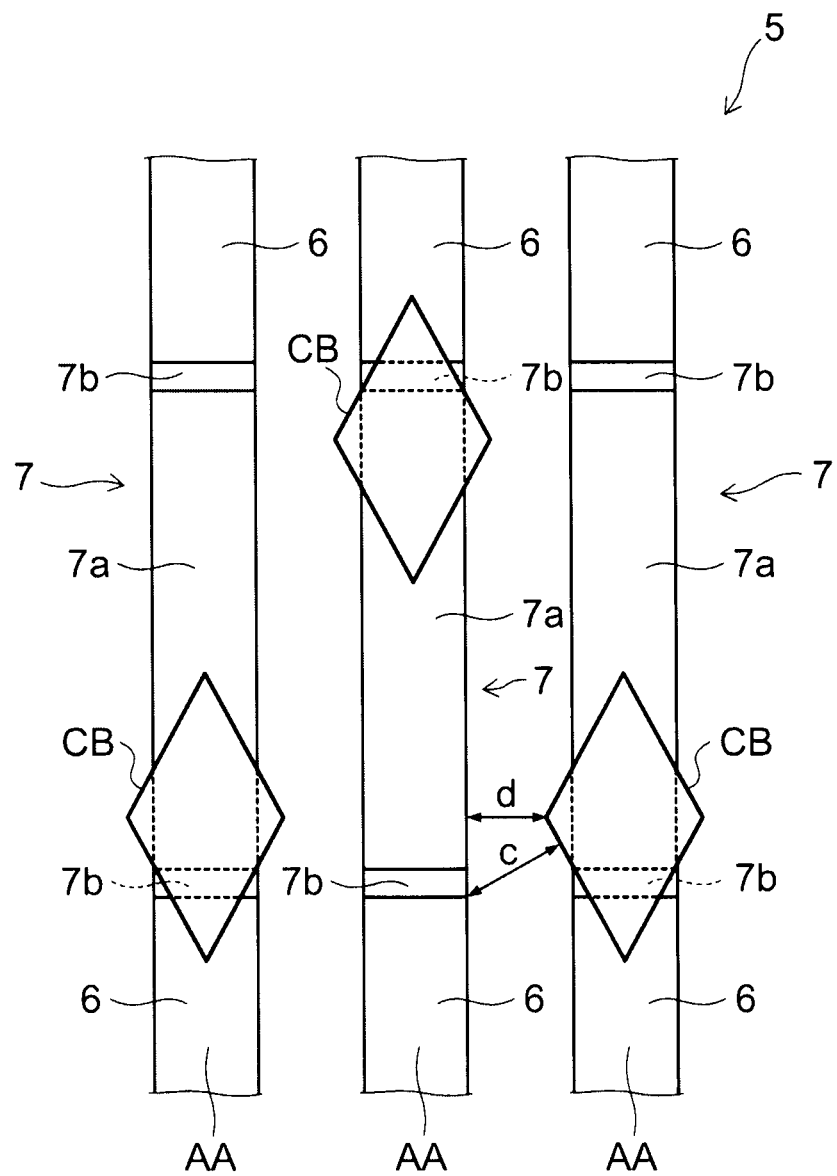
FIG. 7 is a plan view illustrating a semiconductor memory device according to a fifth embodiment.

FIG. 7 is a plan view illustrating the semiconductor memory device according to the embodiment.

In FIG. 7, only a proximity of the recesses of the active areas is schematically illustrated.

In the semiconductor memory device 5 according to the embodiment as illustrated in FIG. 7, the configuration of the bit line contact CB is substantially diamond-shaped as viewed from the Z direction. The length of the bit line contact CB in the Y direction is longer than the length in the X direction. Otherwise, the configuration of the embodiment is similar to that of the first embodiment described above. According to the embodiment as well, operational effects similar to those of the first embodiment described above can be obtained.

A sixth embodiment will now be described.

The embodiment is an embodiment in which the first embodiment described above is illustrated more specifically.

The semiconductor memory device according to the embodiment is, for example, a NAND flash EEPROM (Electrically Erasable Programmable ROM).

Figure 8:
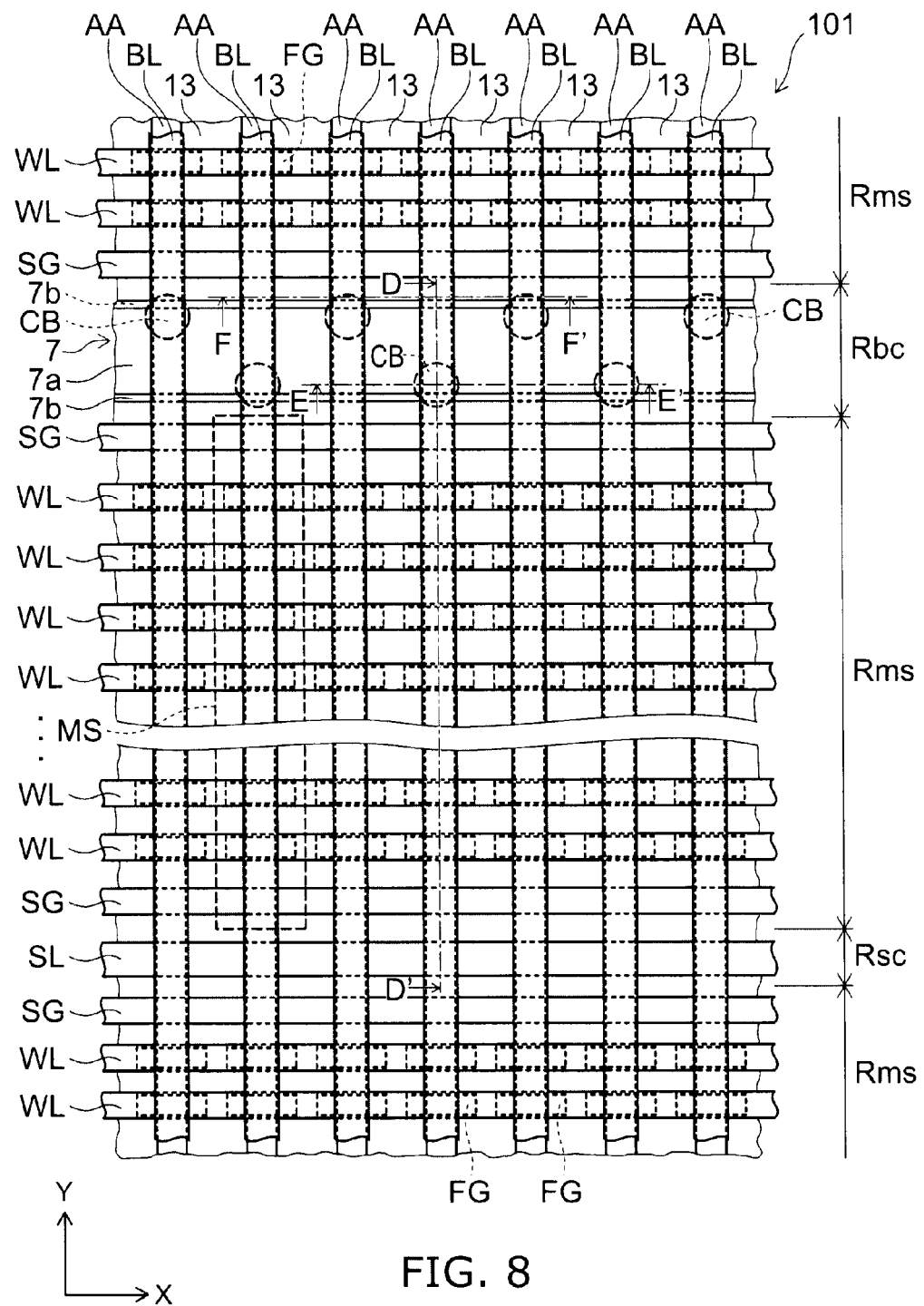
FIG. 8 is a plan view illustrating a semiconductor memory device according to a sixth embodiment.

FIG. 8 is a plan view illustrating the semiconductor memory device according to the embodiment.

Figure 9:
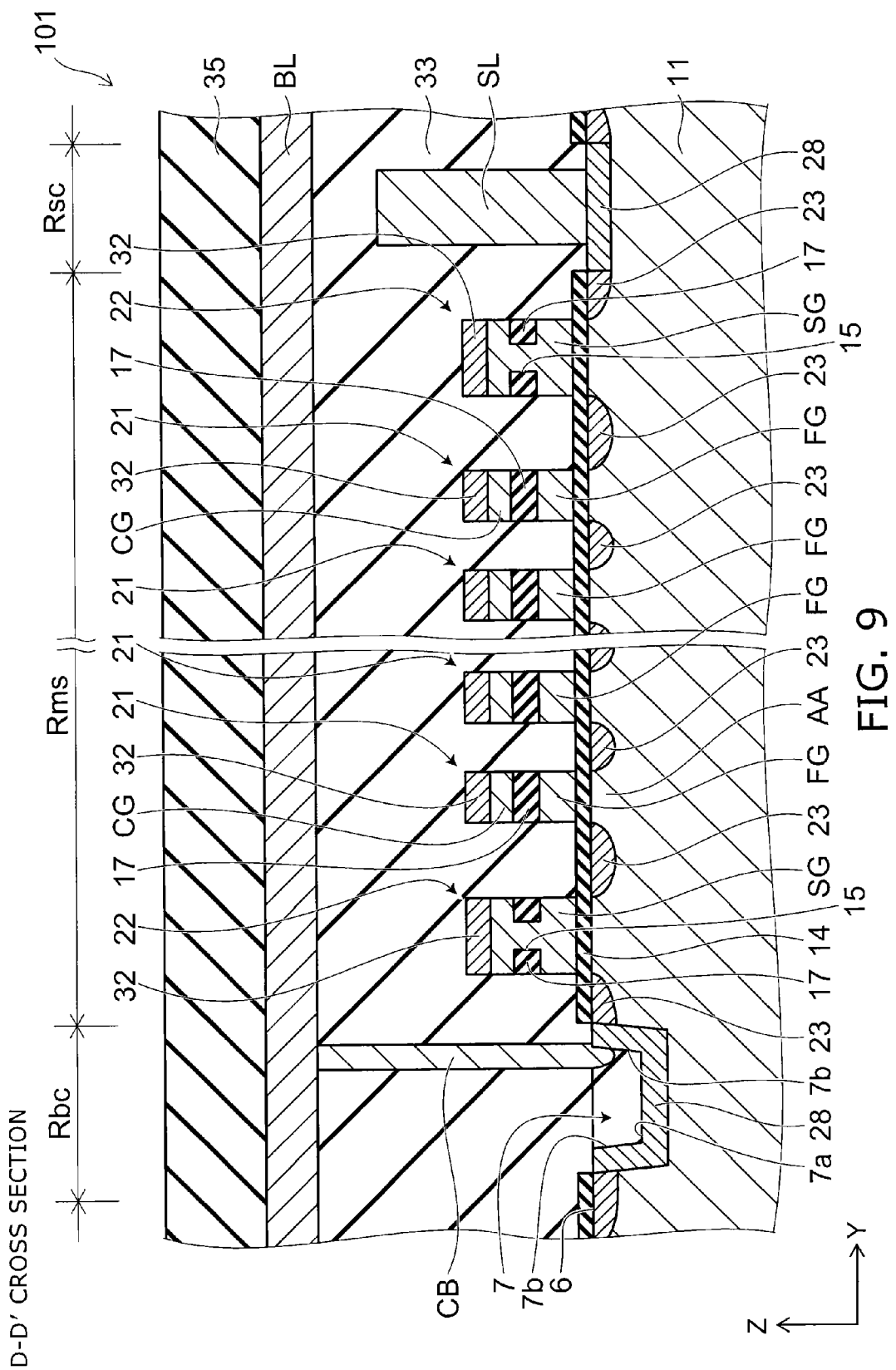
FIG. 9 is a cross-sectional view along line D-D' of FIG. 8.
Figure 10:
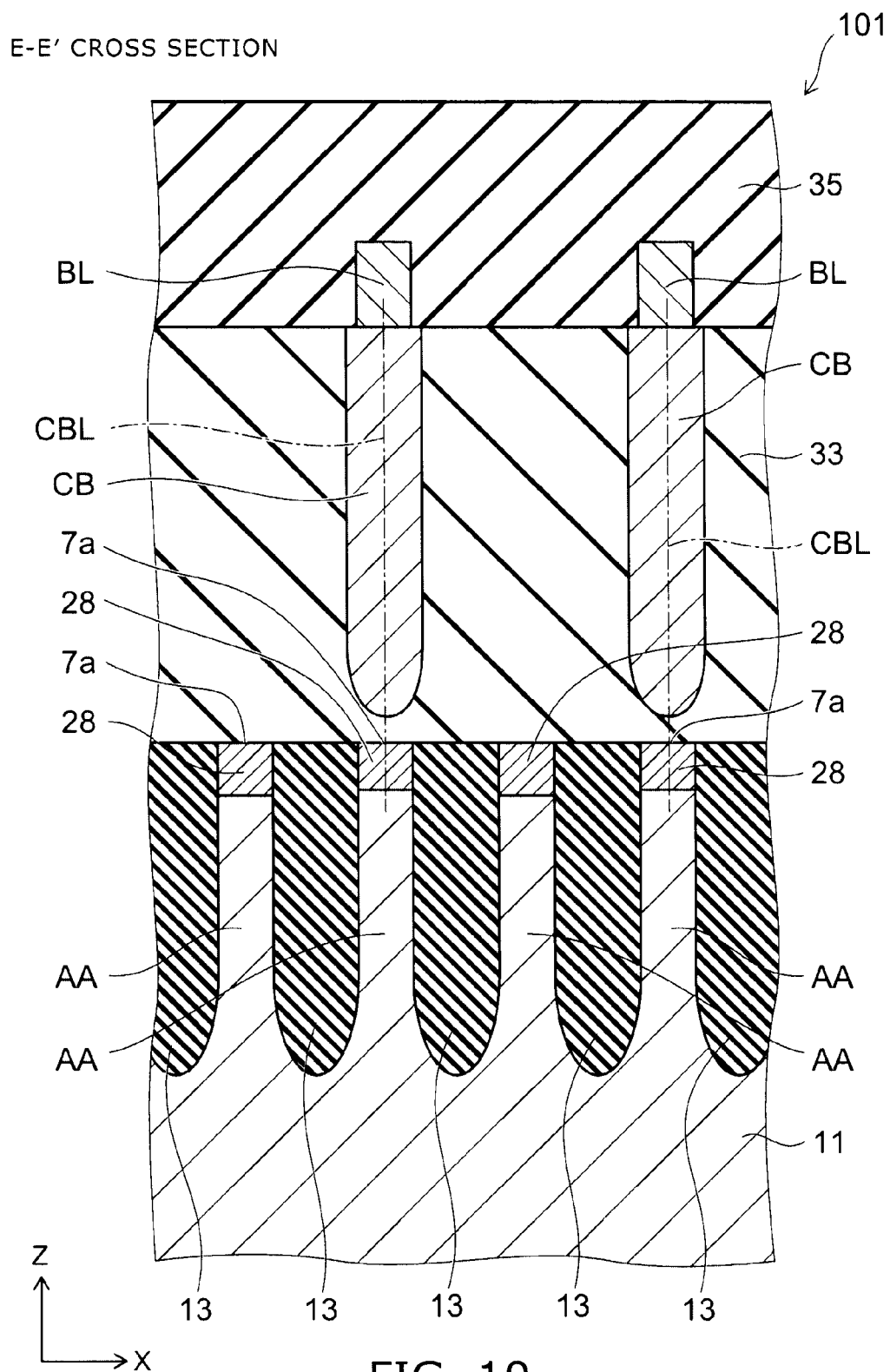
FIG. 10 is a cross-sectional view along line E-E' of FIG. 8.
Figure 11:
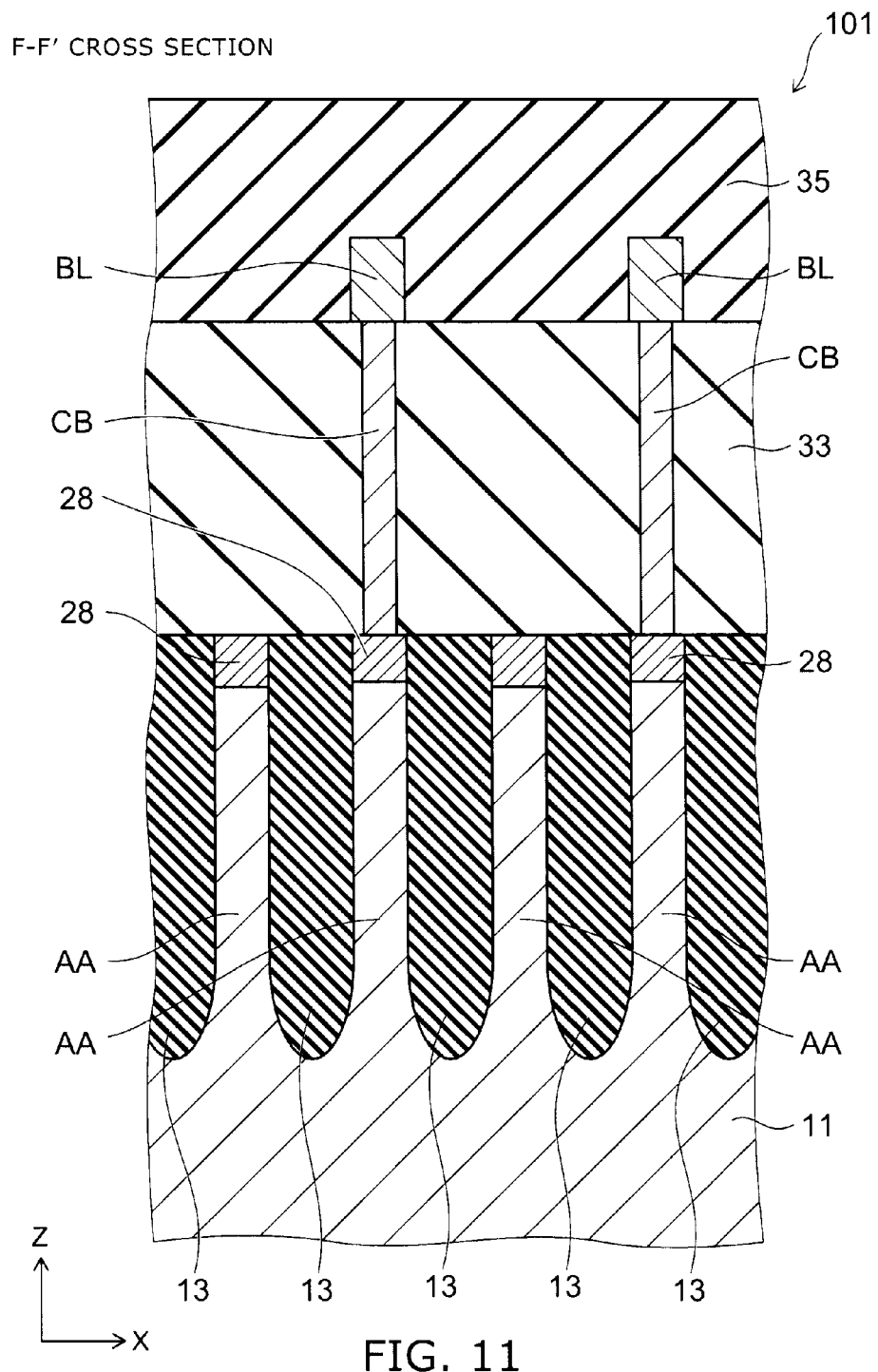
FIG. 11 is a cross-sectional view along line F-F' of FIG. 8.
Figure 12:
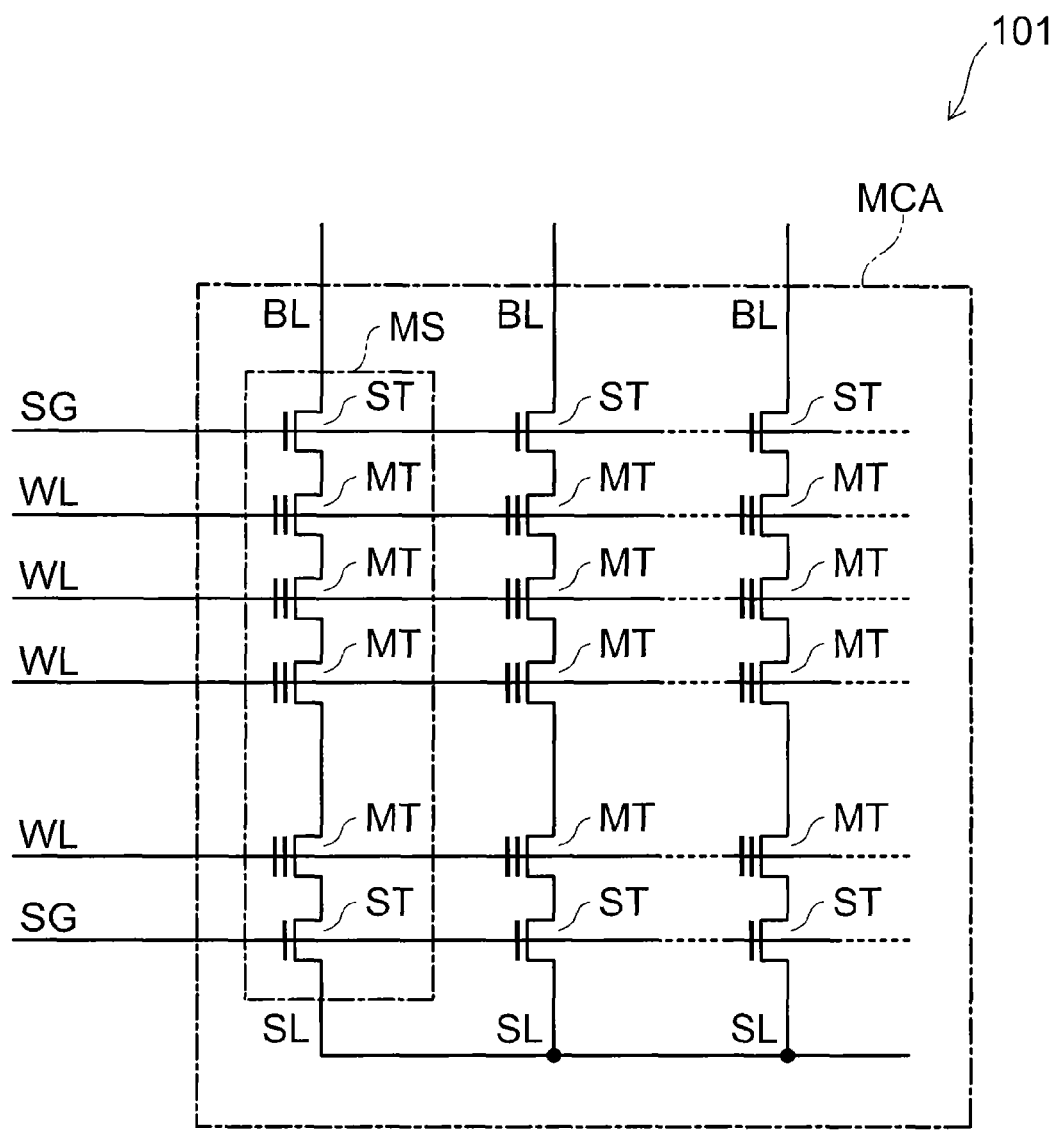
FIG. 12 is a circuit diagram illustrating the semiconductor memory device according to the sixth embodiment.

FIG. 9 is a cross-sectional view along line D-D' of FIG. 8.
FIG. 10 is a cross-sectional view along line E-E' of FIG. 8.
FIG. 11 is a cross-sectional view along line F-F' of FIG. 8.
FIG. 12 is a circuit diagram illustrating the semiconductor memory device according to the embodiment.

Although the configuration of the bit line contact CB is illustrated as being circular as viewed from the Z direction in FIG. 8, an ellipse having its major-diameter direction in the Y direction, etc., may be used similarly to the first embodiment described above. This is similar also for FIG. 13A to FIG. 24C described below.

In the semiconductor memory device 101 according to the embodiment (also referred to hereinbelow as simply the device 101) as illustrated in FIG. 8 to FIG. 11, a silicon substrate 11 of the p conductivity type is provided; an n-type well (not illustrated) is formed inside the silicon substrate 11; and a p-type well (not illustrated) is formed in the upper portion of the n-type well. The p-type well is disposed in the interior of the n-type well as viewed from above (the Z direction). Multiple memory string regions Rms are set to be mutually separated along the Y direction in the interior of the p-type well; and every other region between the memory string regions Rms is a bit line contact region Rbc or a source line contact region Rsc. The multiple STIs (the element-separating insulators) 13 extending in the Y direction are formed between the multiple memory string regions Rms in the upper layer portion of the p-type well; and the upper layer portion of the silicon substrate 11 is partitioned into the multiple active areas AA by the STIs 13.

In the memory string region Rms, a tunneling insulating film 14 made of silicon oxide is formed on the silicon substrate 11; and multiple stacked bodies 21 extending in the X direction are formed thereon. One stacked body 22 extending in the X direction is formed on each of two sides of a group of the multiple stacked bodies 21. The stacked bodies 21 and 22 are disposed to straddle the multiple active areas AA. An n-type diffusion layer 23 into which, for example, arsenic (As) is introduced is formed in regions of the uppermost layer portion of the silicon substrate 11 excluding the regions directly under the stacked bodies 21 and 22.

A floating gate electrode FG made of polysilicon into which a conductive material, e.g., an impurity, is introduced is provided in each of the stacked bodies 21 as a charge storage member. The floating gate electrode FG is divided along the X direction into each of the active areas AA. In the stacked body 21, an insulating film 17 is provided to cover the floating gate electrode FG; and a control gate electrode CG made of a conductive material is provided thereon to form a word line WL. The material of the insulating film 17 may include, for example, one type of insulating material selected from the group consisting of silicon oxide, silicon nitride, lanthanum aluminate, lanthanum silicate, lanthanum aluminum silicate, aluminum oxide, hafnium aluminate, hafnium silicate, zinc oxide, tantalum oxide, strontium oxide, silicon nitride, magnesium oxide, yttrium oxide, hafnium oxide, zirconium oxide, and bismuth oxide or a mixture of multiple types of insulating materials. The insulating film 17 may be a combined film in which layers made of these insulating materials are multiply stacked. The material of the control gate electrode CG may include, for example, a conductive material such as polysilicon into which an impurity is introduced, tungsten, titanium, titanium nitride, tantalum, tantalum nitride, etc. In the case where the control gate electrode CG is formed of polysilicon, the control gate electrode CG is provided in a line configuration extending in the X direction. A silicide layer 32 made of a silicide such as, for example, cobalt silicide or tungsten silicide is formed in the upper portion of the control gate electrode CG.

On the other hand, the selection gate electrode SG extending in the X direction is provided for each of the stacked bodies 22. The conductive material of the floating gate electrode FG is formed integrally with the conductive material of the control gate electrode CG through an opening 15 of the insulating film 17 to form the selection gate electrode SG in the region directly above the active area AA. In the case where the selection gate electrode SG is formed of polysilicon, the silicide layer 32 made of a silicide such as, for example, cobalt silicide or tungsten silicide is formed in the upper portion of the selection gate electrode SG.

The recess 7 is made in the upper surfaces of the active area AA and the STI 13 in the bit line contact region Rbc. The recess 7 extends in the X direction across the multiple active areas AA and the STIs 13 arranged along the X direction. Thereby, the bottom surface 7a of the recess 7 is lower than the upper surface 6 of the active area AA. The Y-direction positions of the recesses 7 are the same between the active areas AA. The two side surfaces 7b of the recess 7 oppose each other in the Y direction and are tilted upward with respect to the perpendicular plane (the XZ plane). An n$^+$-type diffusion layer 28 into which, for example, arsenic is introduced is formed as an impurity diffusion region in the uppermost layer portion of the active area AA.

In the source line contact region Rsc as well, the n$^+$-type diffusion layer 28 into which, for example, arsenic is introduced is formed in the uppermost layer portion of the active area AA. A source line SL made of a conductive material, e.g., tungsten, is formed on the silicon substrate 11. The source line SL straddles, contacts, and is connected commonly to the multiple active areas AA.

An inter-layer insulating film 33 made of, for example, silicon oxide is provided to cover the stacked bodies 21 and 22 on the silicon substrate 11 on the entire surfaces of the memory string region Rms, the bit line contact region Rbc, and the source line contact region Rsc. The bit line contact CB is buried in a portion of the region directly above the active area AA inside the inter-layer insulating film 33. The bit line contact CB is formed of a metal such as, for example, tungsten. A barrier film may be formed on the upper surface of the bit line contact CB. The barrier film is formed of, for example, titanium nitride. The lower end of each of the bit line contacts CB contacts the side surface 7b of the recess 7 and does not contact the bottom surface 7a. This can be confirmed using, for example, a TEM (transmission electron microscopy) photograph. Two bit line contacts CB connected to two mutually-adjacent active areas AA contact side surfaces 7b having mutually different Y-direction positions. Thereby, the bit line contacts CB are disposed in a staggered configuration as viewed from above.

A bit line BL extending in the Y direction is provided in a region on the inter-layer insulating film 33 to include a region directly above the active area AA. The bit lines BL are connected to the upper ends of the bit line contacts CB respectively. An inter-layer insulating film 35 made of, for example, a silicon oxide film is provided on the inter-layer insulating film 33 to bury the bit line BL. The inter-layer insulating film 35, the inter-layer insulating film 33, and the tunneling insulating film 14 are not illustrated for convenience of illustration in FIG. 8.

In the device 101, the bit line BL is connected to the n$^+$-type diffusion layer 28 of the active area AA via the bit line contact CB in the bit line contact region Rbc. On the other hand, in the source line contact region Rsc, the source line SL is directly connected to the n$^+$-type diffusion layer 28 of the active area AA. In the memory string region Rms, a memory cell transistor MT is formed in each of the most proximal portions between the control gate electrodes CG and the active areas AA. A selection transistor ST is formed in the most proximal portions between the selection gate electrodes SG and the active areas AA.

Thereby, as illustrated in FIG. 12, a memory string MS is formed in which multiple memory cell transistors MT are connected in series between the bit line BL and the source line SL for each of the active areas AA; and the selection transistors ST are connected to two sides thereof. A memory cell array MCA is formed of multiple memory strings MS.

A method for manufacturing the semiconductor memory device 101 according to the embodiment will now be described.

FIG. 13A to FIG. 24C illustrate the method for manufacturing the semiconductor memory device according to the embodiment. Drawing A of each of these drawings is a process plan view; drawing B of each of these drawings is a process cross-sectional view along line D-D' of drawing A; and drawing C of each of these drawings is a process cross-sectional view along line E-E' of drawing A.

Only portions of the bit line contact region Rbc and the memory string regions Rms adjacent thereto are illustrated in FIG. 13A to FIG. 24C.

Figure 13A:
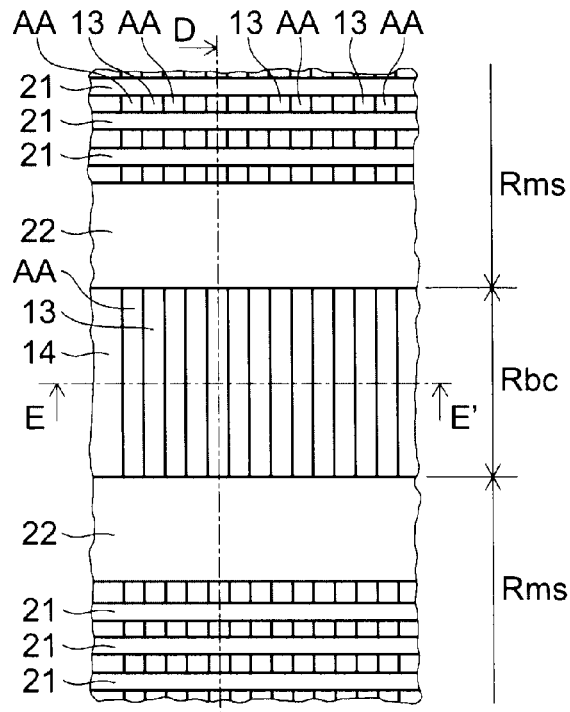
FIGS. 13A to 13C are process views illustrating a method for manufacturing the semiconductor memory device according to the sixth embodiment.
Figure 13B:
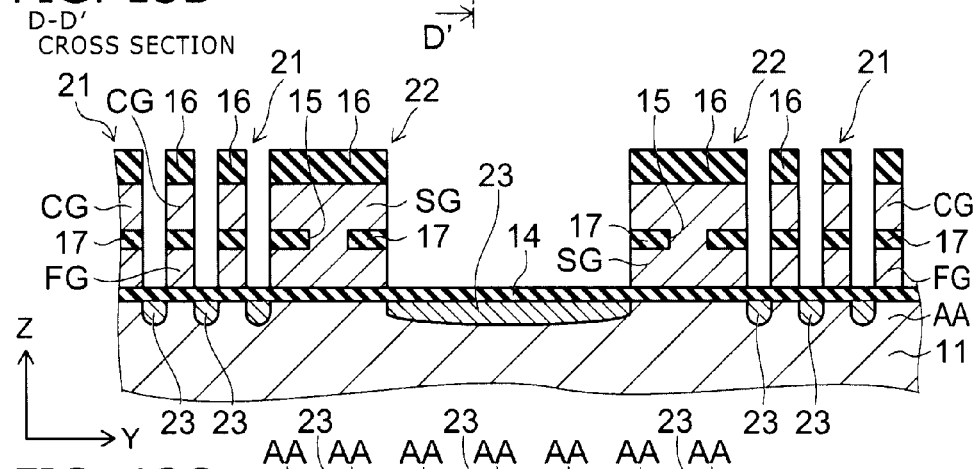
Figure 13C:
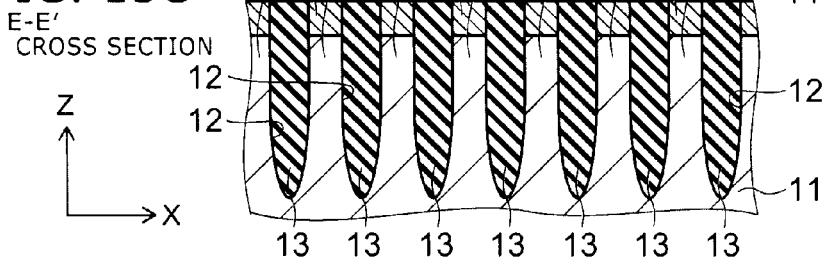

First, as illustrated in FIG. 13A to 13C, the silicon substrate 11 is prepared. For example, the silicon substrate 11 is a portion of a p-type silicon wafer. In the silicon substrate 11, multiple memory string regions Rms are set to be separated from each other along the Y direction. Every other region between the memory string regions Rms is used as a bit line contact region Rbc or a source line contact region Rsc (referring to FIG. 8).

An n-type well (not illustrated) is formed inside the silicon substrate 11. Then, a p-type well (not illustrated) is formed in the upper portion of the n-type well. The memory string region Rms, the bit line contact region Rbc, and the source line contact region Rsc described above are disposed inside one p-type well. Then, the tunneling insulating film 14 is formed by depositing, for example, silicon oxide. Although the tunneling insulating film 14 normally is insulative, the tunneling insulating film 14 is a film through which a tunneling current flows when a prescribed voltage is applied within the range of the drive voltage of the device 101. Then, a conductive material, e.g., a polysilicon film containing, for example, an impurity, is deposited on the tunneling insulating film 14. Then, a trench 12 is multiply made in line configurations extending in the Y direction by selectively etching the silicon substrate 11. Each of the trenches 12 is made to pass through the multiple memory string regions Rms and the bit line contact regions Rbc and the source line contact regions Rsc between the memory string regions Rms.

Continuing, the STI 13 is formed by filling silicon oxide as an insulating material into the interior of the trench 12. The portion of the upper layer portion of the silicon substrate 11 between the STIs 13 becomes the active area AA. In other words, the upper layer portion of the silicon substrate 11 is partitioned by the STI 13 into the multiple active areas AA, which are made of p-type monocrystalline silicon, extend in the Y direction, and are separated from each other.

Then, the insulating film 17 made of, for example, an ONO film is deposited to cover the polysilicon film. Then, the polysilicon film is deposited; and subsequently, the opening 15 is made in the insulating film 17 in the region where the selection gate electrode SG (referring to FIG. 8) is to be formed. Continuing, the polysilicon film and the silicon nitride film are stacked in this order. At this time, the subsequently-deposited polysilicon film is filled also inside the opening 15 to contact the previously-deposited polysilicon film. Then, a stopper film 16 is formed by patterning the silicon nitride film into multiple line configurations extending in the X direction using lithography.

Continuing, the polysilicon film, the insulating film 17, and the polysilicon film described above are selectively removed by performing dry etching using the stopper film 16 as a mask. At this time, the tunneling insulating film 14 is not etched. At this time, in the memory string region Rms, the polysilicon film of the upper side is divided to form the control gate electrodes CG extending in the X direction. The polysilicon film on the lower side is divided to form the floating gate electrodes FG arranged in a matrix configuration in the X direction and the Y direction.

Thereby, the stacked body 21 is multiply formed on the tunneling insulating films 14 in the regions other than both Y-direction end portions of the memory string region Rms. Each of the stacked bodies 21 extends in the X direction to straddle the multiple active areas AA. The insulating film 17 buries the floating gate electrode FG made of polysilicon and divided along the X direction for each of the stacked bodies 21; and the control gate electrode CG made of polysilicon and the stopper film 16 are provided thereon. A pair of the stacked bodies 22 is formed respectively at both Y-direction end portions of the memory string region Rms that is, on both sides of the group of the multiple stacked bodies 21 arranged along the Y direction. Although the basic layer structure of the stacked body 22 is similar to that of the stacked body 21, the polysilicon film used to form the floating gate electrode FG is connected to the polysilicon film used to form the control gate electrode CG through the opening 15 to form the selection gate electrode SG as an entirety. The width of the stacked body 22 is wider than the width of the stacked body 21. The floating gate electrode FG, the insulating film 17, the control gate electrode CG, and the stopper film 16 of the bit line contact region Rbc are removed by etching.

Then, ion implantation of an impurity such as, for example, arsenic (As) is performed into the silicon substrate 11 using the stacked bodies 21 and 22 as a mask. Thereby, the n-type diffusion layer 23 is formed in the regions of the uppermost layer portion of the silicon substrate 11 excluding the region directly under the stacked bodies 21 and 22.

Figure 14A:
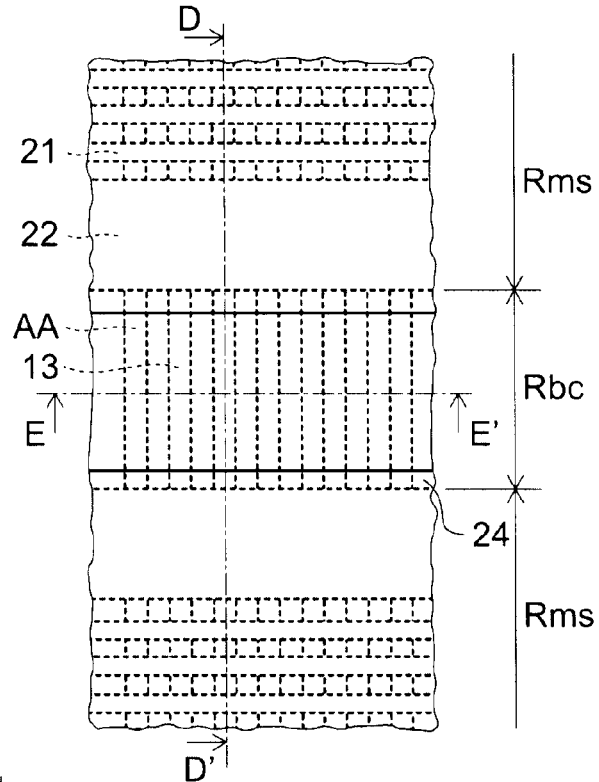
FIGS. 14A to 14C are process views illustrating a method for manufacturing the semiconductor memory device according to the sixth embodiment.
Figure 14B:
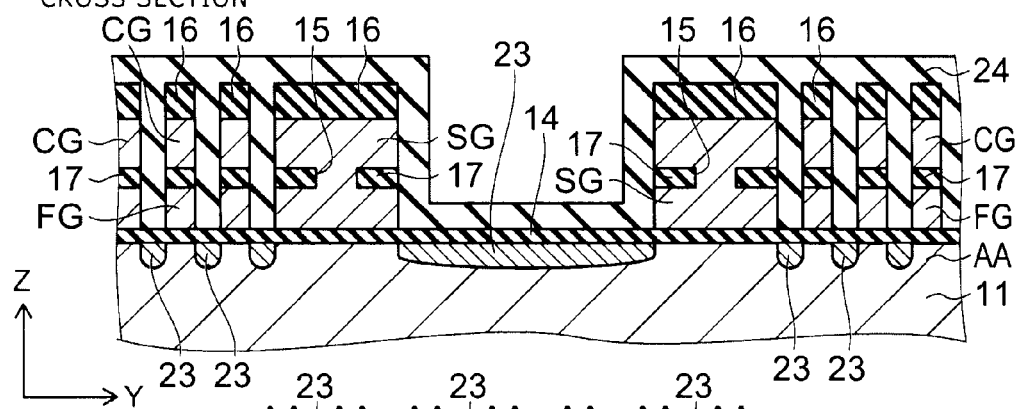
Figure 14C:
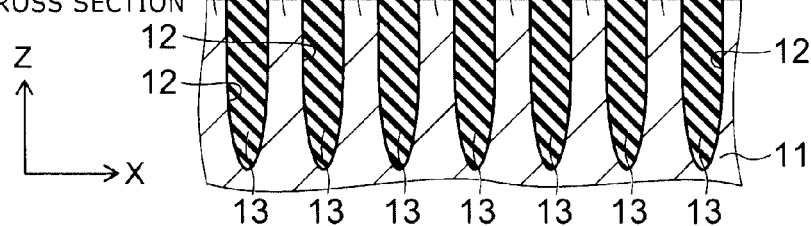

Continuing as illustrated in FIG. 14A to 14C, a silicon oxide film 24 is formed by depositing an insulating material, e.g., silicon oxide, on the entire surface. In the memory string region Rms, the silicon oxide film 24 is filled between the stacked bodies 21 and between the stacked body 21 and the stacked body 22 and is formed also on the side surfaces of the stacked body 22 on the bit line contact region Rbc side and the source line contact region Rsc side. The silicon oxide film 24 is formed on the upper surface of the tunneling insulating film 14 in the bit line contact region Rbc and the source line contact region Rsc.

Figure 15A:
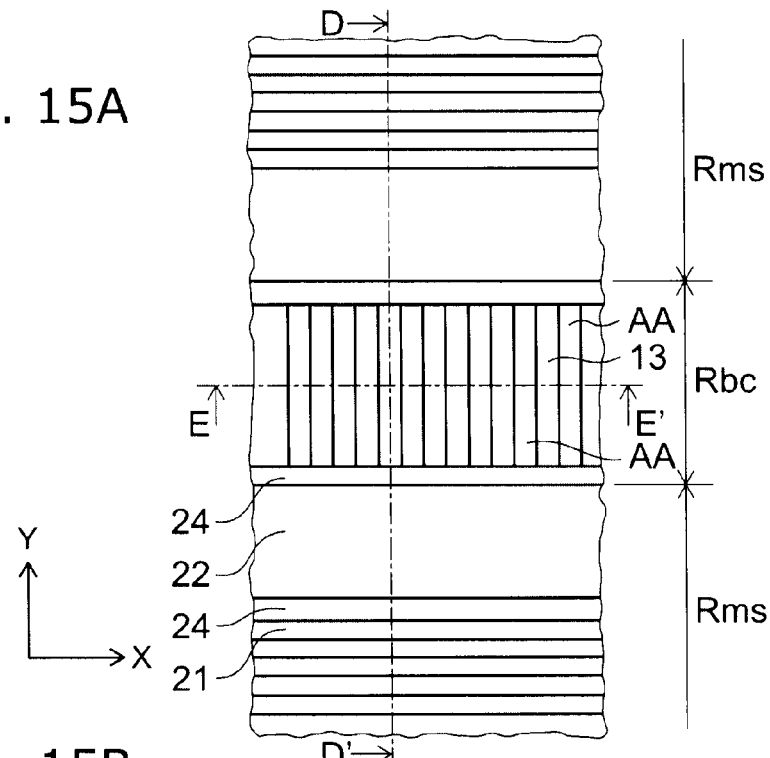
FIGS. 15A to 15C are process views illustrating a method for manufacturing the semiconductor memory device according to the sixth embodiment.
Figure 15B:
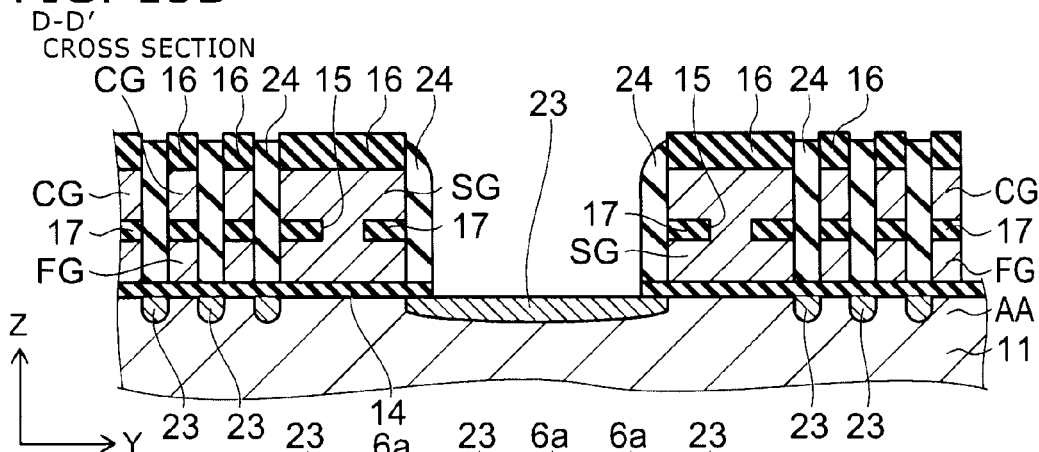
Figure 15C:
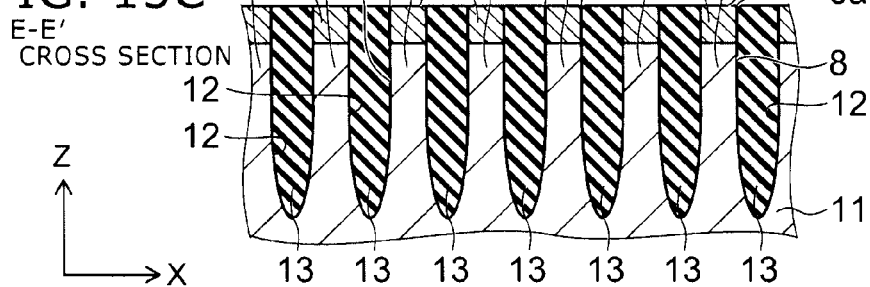

Then, as illustrated in FIGS. 15A to 15C, anisotropic etching, e.g., RIE (reactive ion etching), is performed. Thereby, the silicon oxide film 24 is removed from the upper surfaces of the stacked bodies 21 and 22 in the memory string region Rms. The silicon oxide film 24 remains between the stacked bodies 21 and 22. The silicon oxide film 24 is used as a spacer by also remaining on the side surfaces of the stacked body 22 facing the bit line contact region Rbc and the source line contact region Rsc.

This RIE also removes the silicon oxide film 24 and the tunneling insulating film 14 from the silicon substrate 11 to expose the active area AA and the STI 13 in the bit line contact region Rbc and the source line contact region Rsc. At this time, the upper surface of the STI 13 is positioned slightly lower than the upper surface of the active area AA in the bit line contact region Rbc and the source line contact region Rsc because the STI 13, which is made of silicon oxide, is etched at an etching rate higher than that of the active area AA, which is made of silicon. The corner 6a between the side surface 8 and the upper surface 6 of the active area AA is rounded. Thereby, the corner 6a has the curvature radius $r_b$ (referring to FIG. 3). For convenience of illustration in FIG. 15C, the upper surfaces of the STI 13 and the active area AA are illustrated as being flat. This is similar for subsequent drawings as well.

Figure 16A:
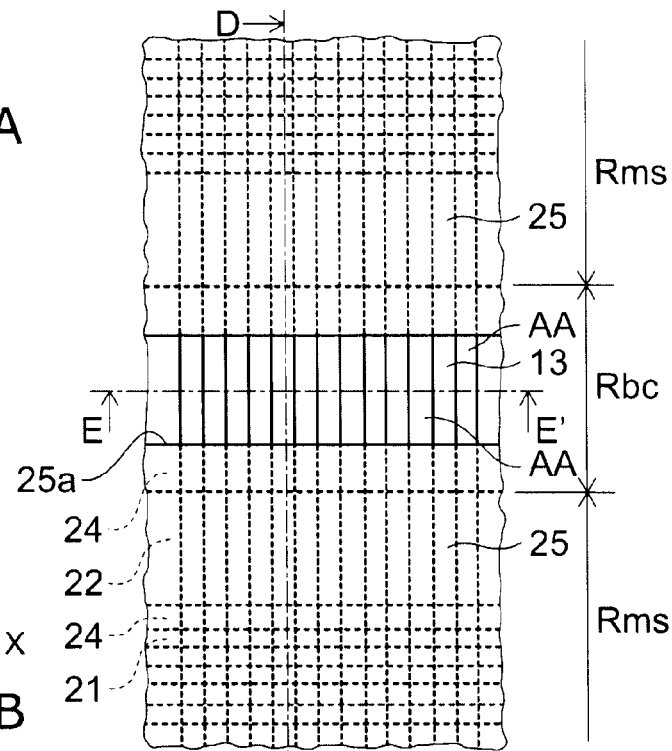
FIGS. 16A to 16C are process views illustrating a method for manufacturing the semiconductor memory device according to the sixth embodiment.
Figure 16B:
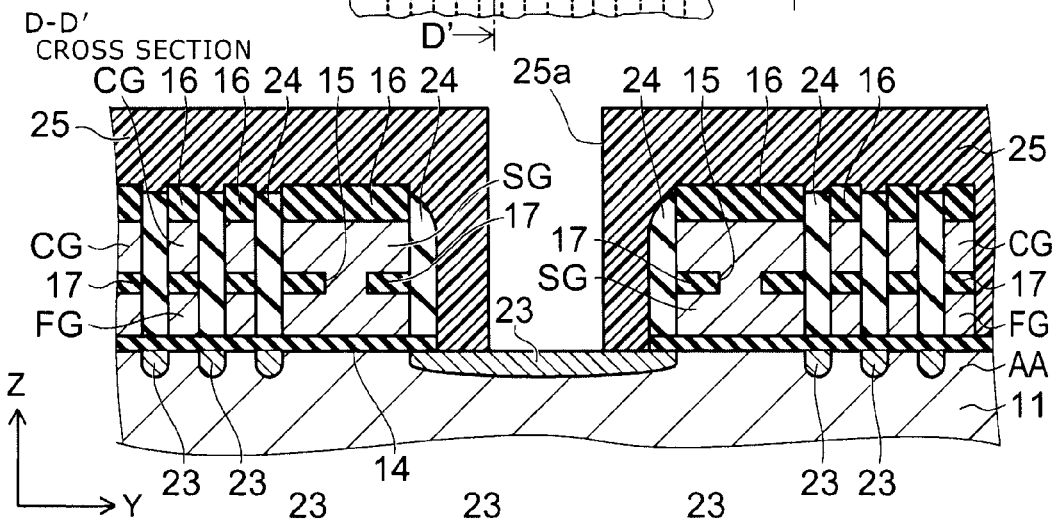
Figure 16C:
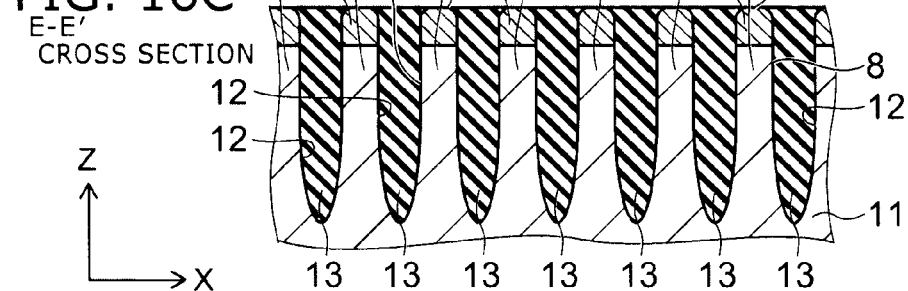

Then, as illustrated in FIGS. 16A to 16C, a resist mask 25 is formed to cover a portion of the silicon substrate 11 and the entire stacked bodies 21 and 22. An opening 25a is made in the resist mask 25 in a band configuration extending in the X direction in the Y-direction central portion of the bit line contact region Rbc. In other words, the resist mask 25 is formed to cover the entire memory string region Rms, the entire source line contact region Rsc, and both Y-direction end portions of the bit line contact region Rbc while leaving the Y-direction central portion of the bit line contact region Rbc exposed.

Figure 17A:
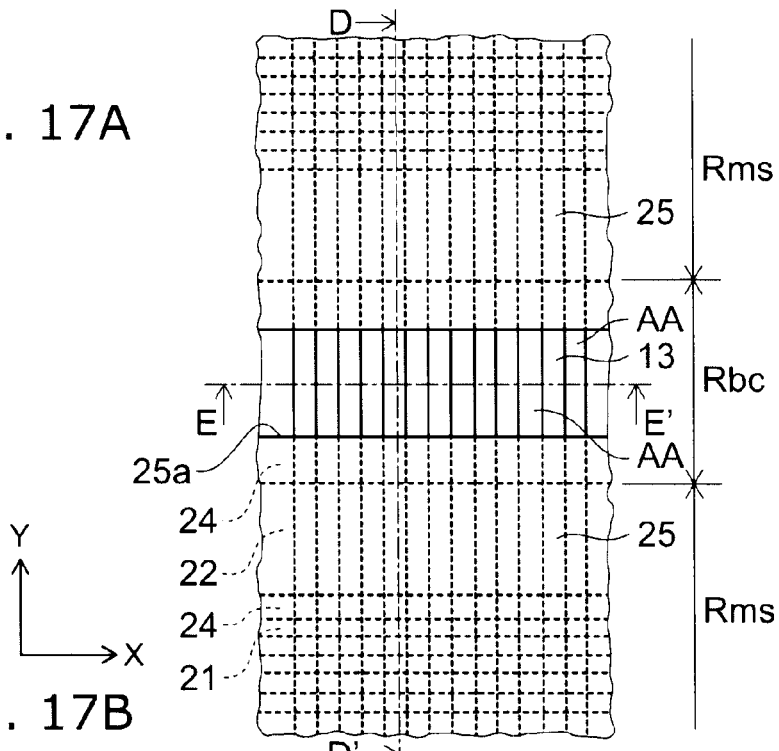
FIGS. 17A to 17C are process views illustrating a method for manufacturing the semiconductor memory device according to the sixth embodiment.
Figure 17B:
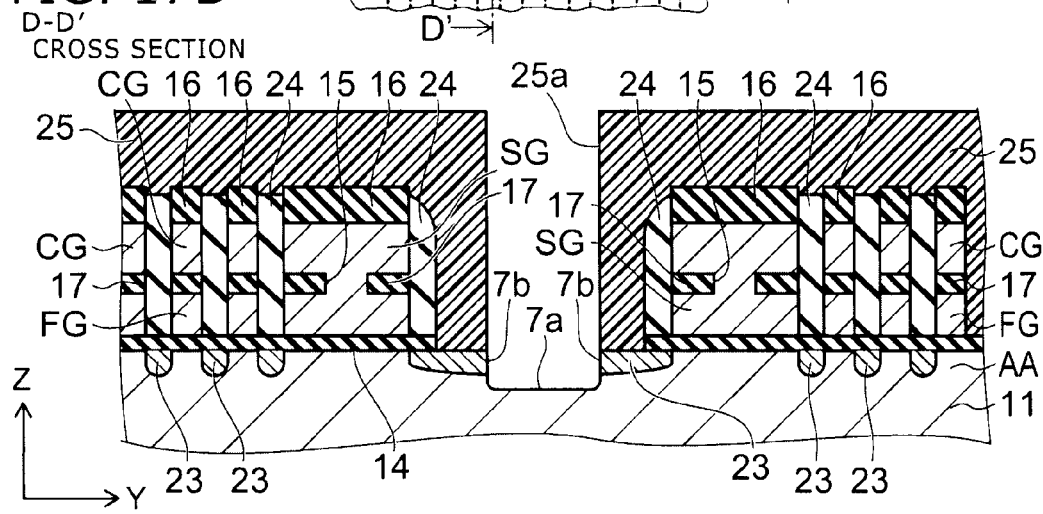
Figure 17C:
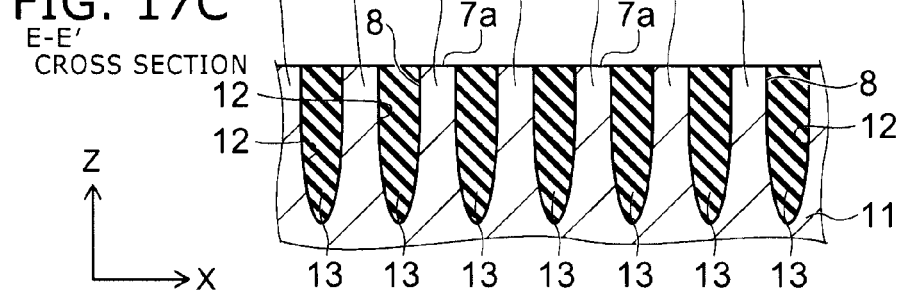

Continuing as illustrated in FIGS. 17A to 17C, anisotropic etching is performed by, for example, RIE using the resist mask 25 as a mask. Thereby, the active areas AA and the STIs 13 in the region directly under the opening 25a are dug out. As a result, the recess 7 is made in the upper surface of the silicon substrate 11 in the bit line contact region Rbc. The recess 7 extends in the X direction to cross the active areas AA and the STIs 13 which are arranged alternately. The RIE further rounds the corner 7c between the bottom surface 7a of the recess 7 and the side surface 8 in the active area AA. Thereby, the curvature radius $r_a$ of the corner 7c becomes greater than the curvature radius $r_b$ of the corner 6a which is covered with the resist mask 25. Subsequently, the resist mask 25 (referring to FIG. 17B) is removed.

Figure 18A:
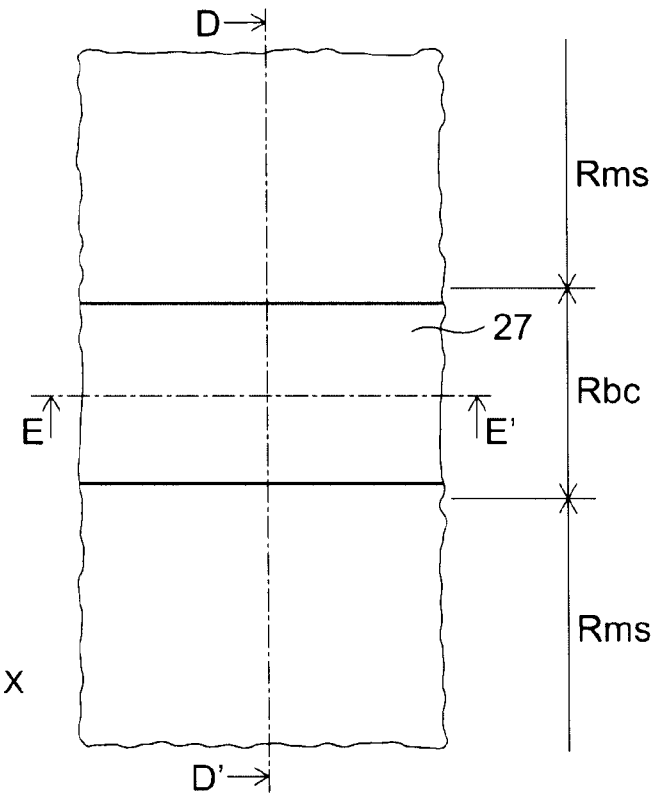
FIGS. 18A to 18C are process views illustrating a method for manufacturing the semiconductor memory device according to the sixth embodiment.
Figure 18B:
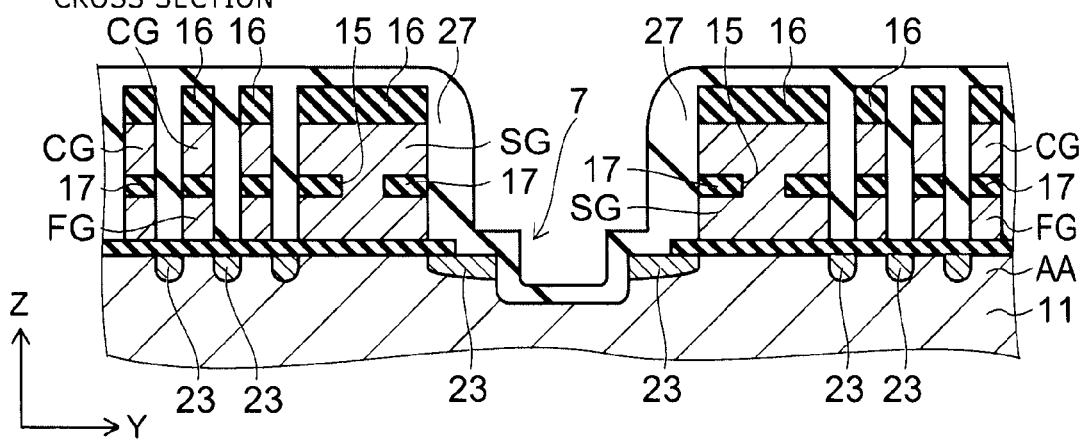
Figure 18C:
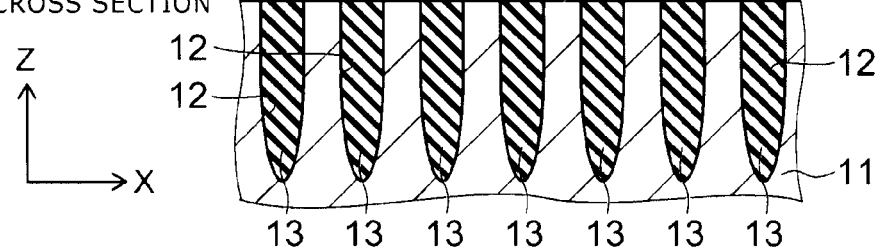

Then, as illustrated in FIGS. 18A to 18C, silicon oxide is deposited on the entire surface. This silicon oxide is used integrally with the silicon oxide film 24 remaining in the memory string region Rms to form a silicon oxide film 27.

The silicon oxide film 27 is formed to protect the silicon substrate 11 exposed in the bit line contact region Rbc.

Figure 19A:
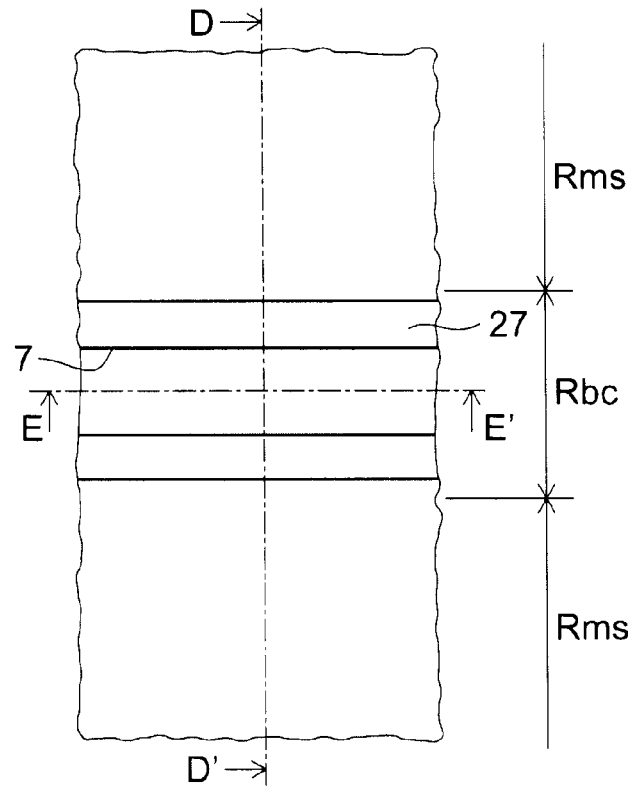
FIGS. 19A to 19C are process views illustrating a method for manufacturing the semiconductor memory device according to the sixth embodiment.
Figure 19B:
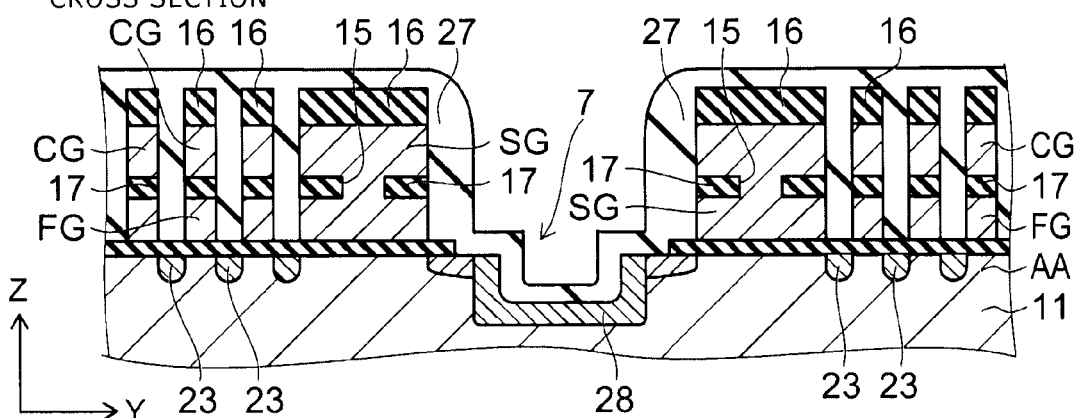
Figure 19C:
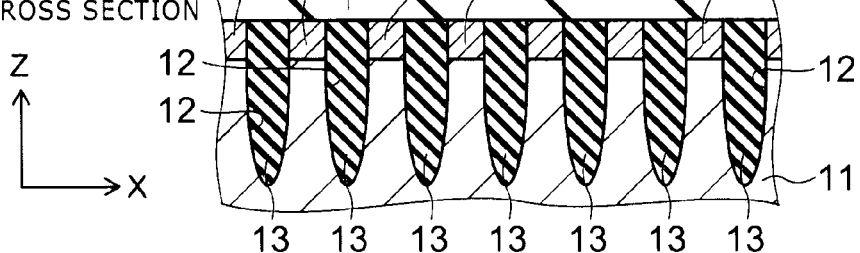

Continuing as illustrated in FIGS. 19A to 19C, ion implantation of arsenic (As) is performed through the silicon oxide film 27. Thereby, the $n^+$-type diffusion layer 28 is formed in the uppermost layer portion of the active area AA in the bit line contact region Rbc and the source line contact region Rsc. Subsequently, the source line SL is formed in the source line contact region Rsc to connect to the $n^+$-type diffusion layer 28.

Figure 20A:
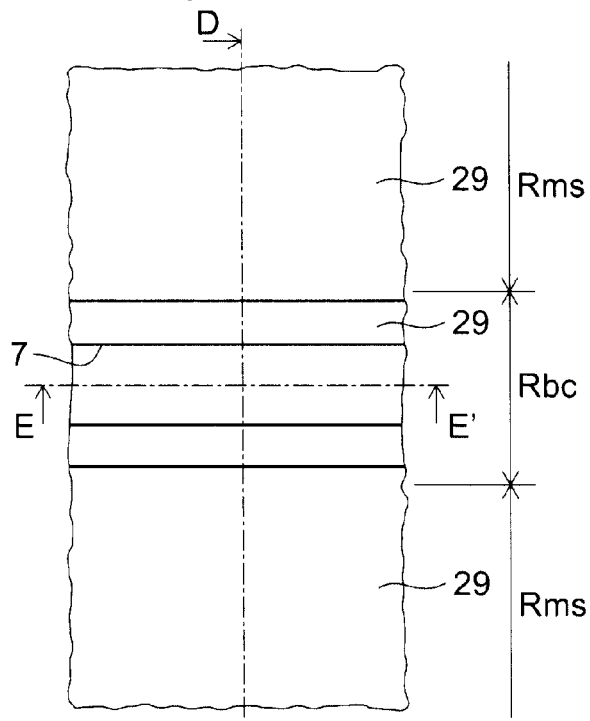
FIGS. 20A to 20C are process views illustrating a method for manufacturing the semiconductor memory device according to the sixth embodiment.
Figure 20B:
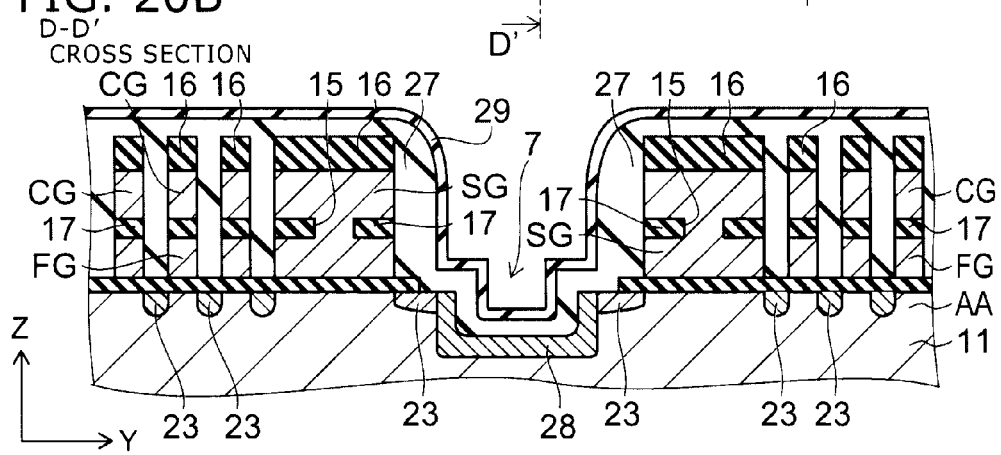
Figure 20C:
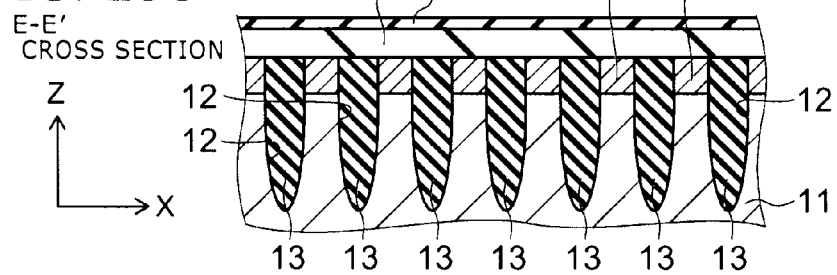

Then, as illustrated in FIGS. 20A to 20C, a silicon nitride film 29 is formed on the entire surface. The silicon nitride film 29 prevents diffusion of the impurity and functions as a stopper when performing CMP (chemical mechanical polishing) in a subsequent process. The portion of the silicon nitride film 29 formed in the memory string region Rms is formed to be substantially flat to cover the stacked bodies 21 and 22; and the portions of the silicon nitride film 29 formed in the bit line contact region Rbc and the source line contact region Rsc are concave with respect to the portion formed in the memory string region Rms.

The portion of the silicon nitride film 29 that covers the recess 7 in the bit line contact region Rbc is concave to reflect the configuration of the recess 7.

Figure 21A:
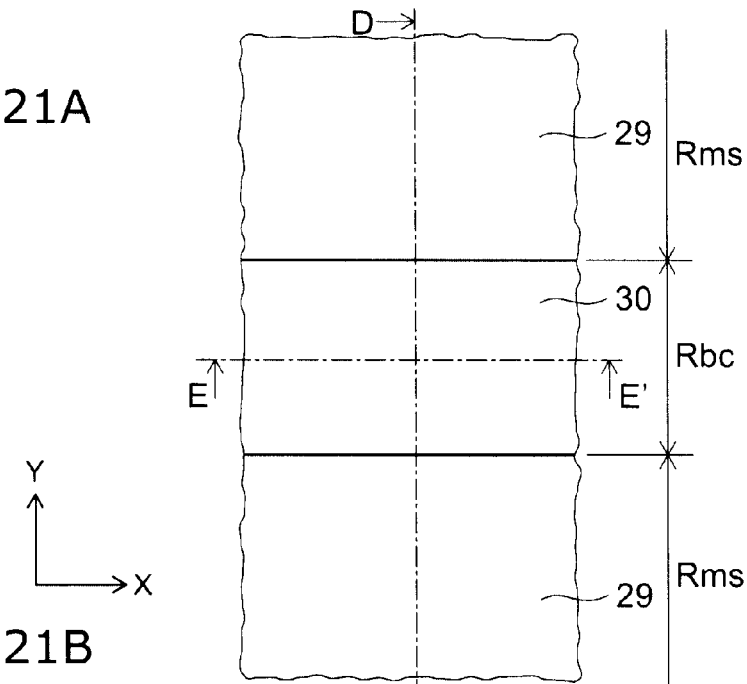
FIGS. 21A to 21C are process views illustrating a method for manufacturing the semiconductor memory device according to the sixth embodiment.
Figure 21B:
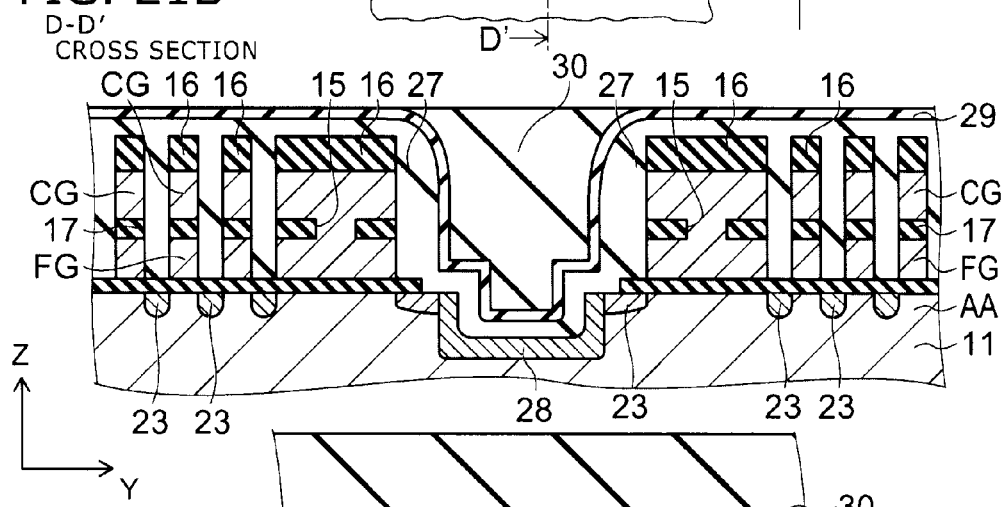
Figure 21C:
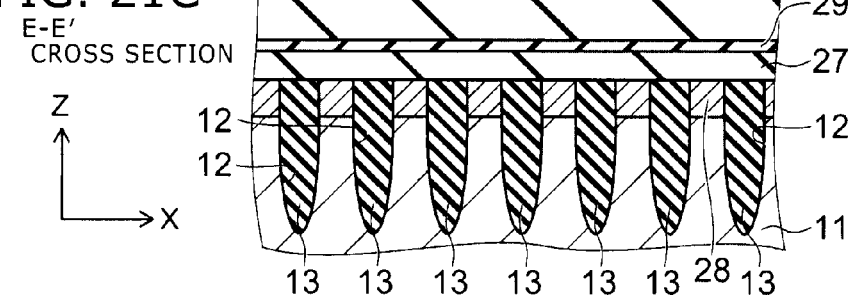

Then, an insulating material such as, for example, silicon oxide is deposited on the entire surface. Subsequently, the insulating material deposited on the silicon nitride film 29 in the memory string region Rms is removed by CMP using the silicon nitride film 29 as a stopper. Thereby, as illustrated in FIGS. 21A to 21C, an inter-layer insulating member 30 is filled into the bit line contact region Rbc and the source line contact region Rsc.

Figure 22A:
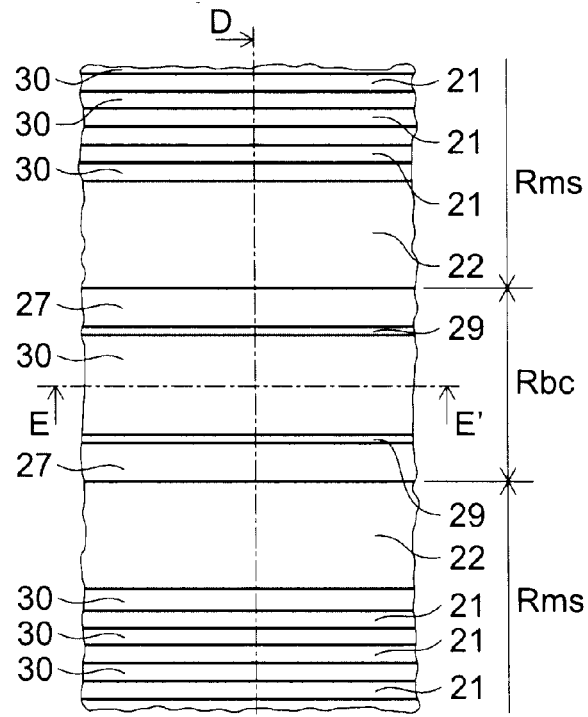
FIGS. 22A to 22C are process views illustrating a method for manufacturing the semiconductor memory device according to the sixth embodiment.
Figure 22B:
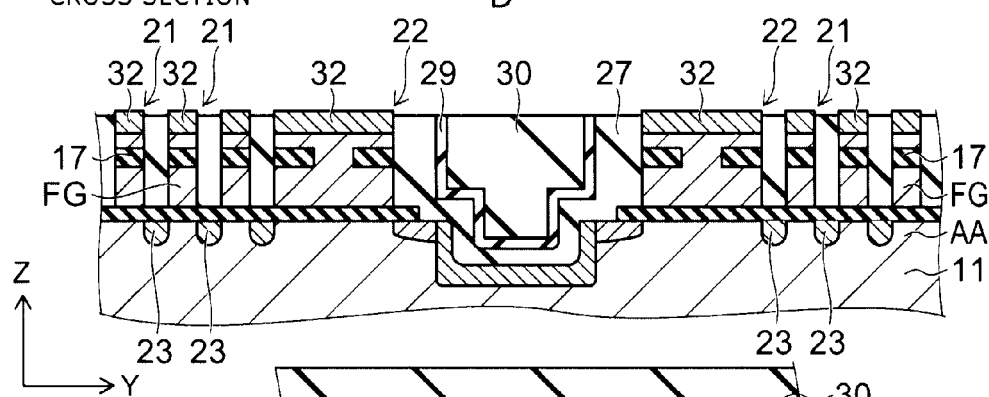
Figure 22C:
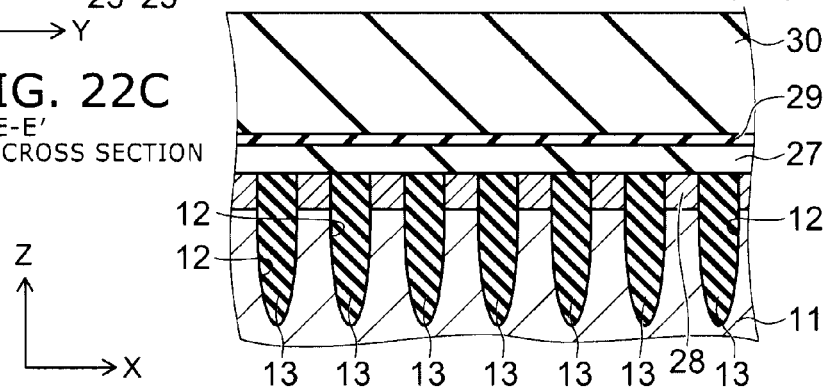

Continuing as illustrated in FIGS. 22A to 22C, etching is performed on the entire surface. This etching is performed until the upper surfaces of the control gate electrode CG of the stacked body 21 and the selection gate electrode SG of the stacked body 22 are exposed. Thereby, the portions of the inter-layer insulating member 30, the silicon nitride film 29, and the silicon oxide film 27 that are positioned higher than the upper surfaces of the stacked bodies 21 and 22 are removed. Then, siliciding is performed to form the silicide layer 32 in the upper portion of the control gate electrode CG and the upper portion of the selection gate electrode SG. The silicide layer 32 is formed of, for example, cobalt silicide or tungsten silicide.

Figure 23A:
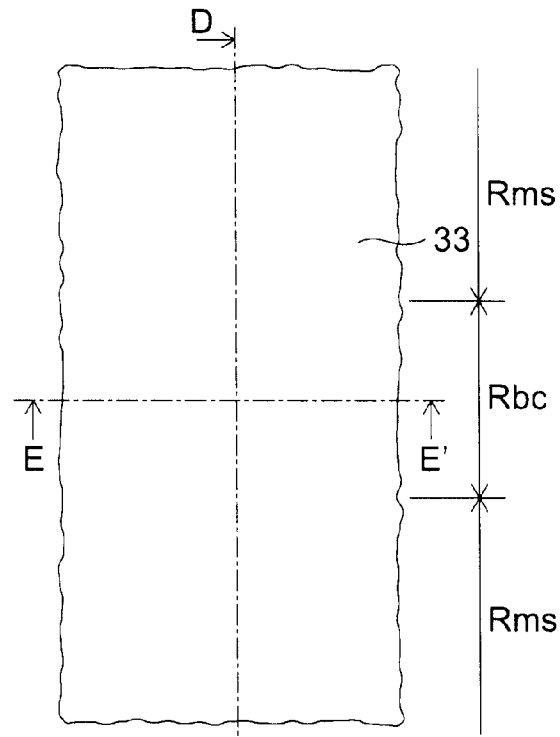
FIGS. 23A to 23C are process views illustrating a method for manufacturing the semiconductor memory device according to the sixth embodiment.
Figure 23B:
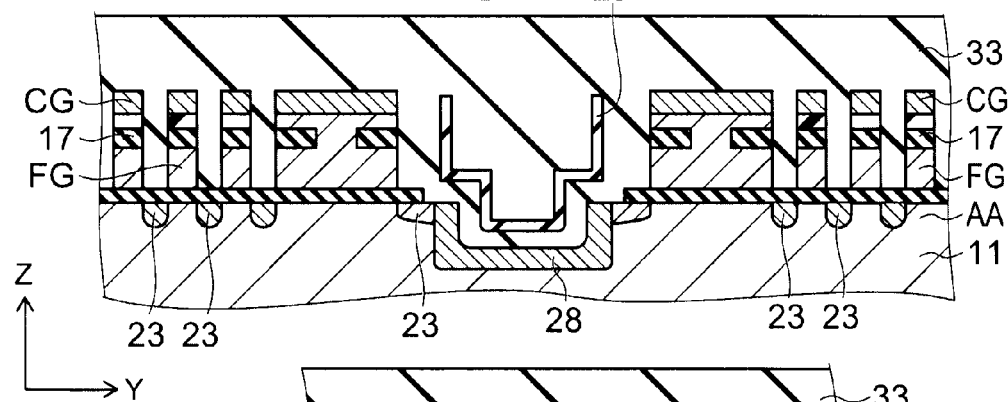
Figure 23C:
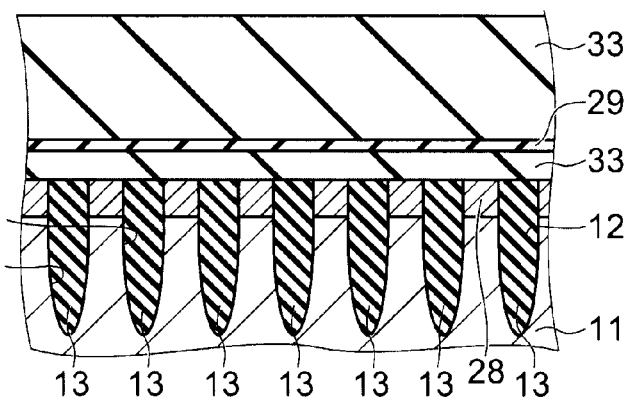

Then, as illustrated in FIGS. 23A to 23C, an insulating material such as, for example, silicon oxide is deposited on the entire surface. This insulating material is used integrally with the silicon oxide film 27 and the inter-layer insulating member 30 to form the inter-layer insulating film 33. Although a portion of the silicon nitride film 29 remains inside the inter-layer insulating film 33, this is not illustrated in FIG. 8 to FIG. 10.

Figure 24A:
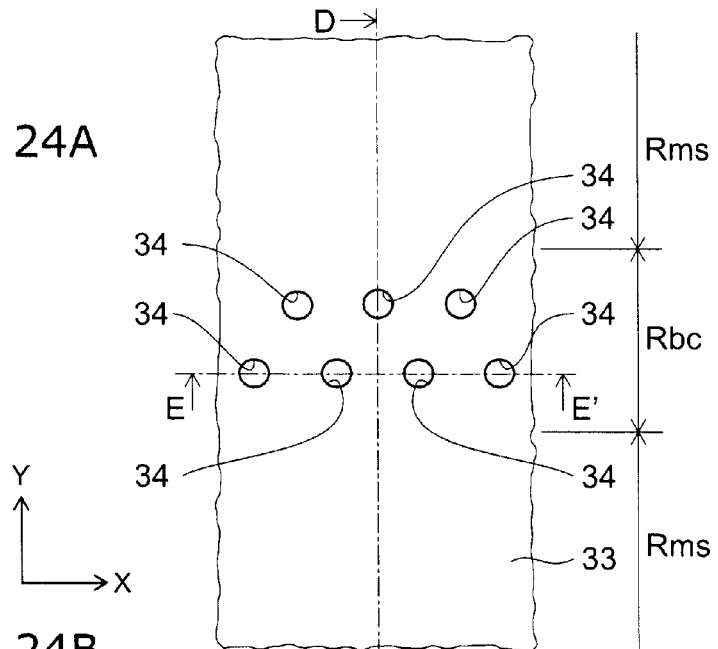
FIGS. 24A to 24C are process views illustrating a method for manufacturing the semiconductor memory device according to the sixth embodiment.
Figure 24B:
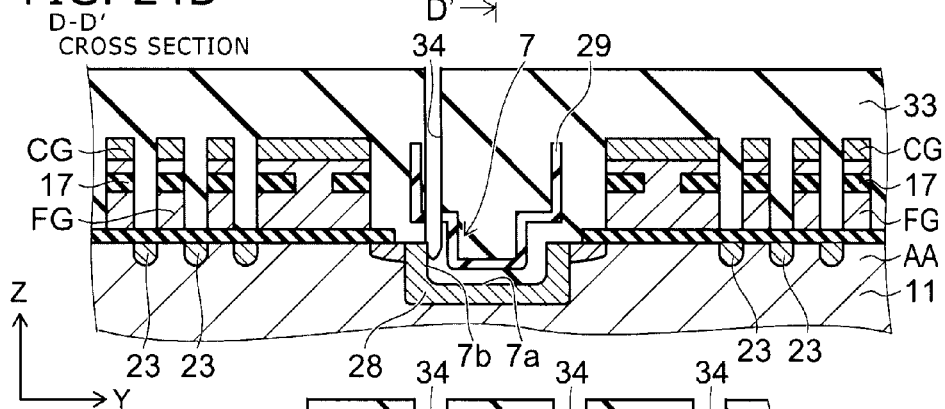
Figure 24C:
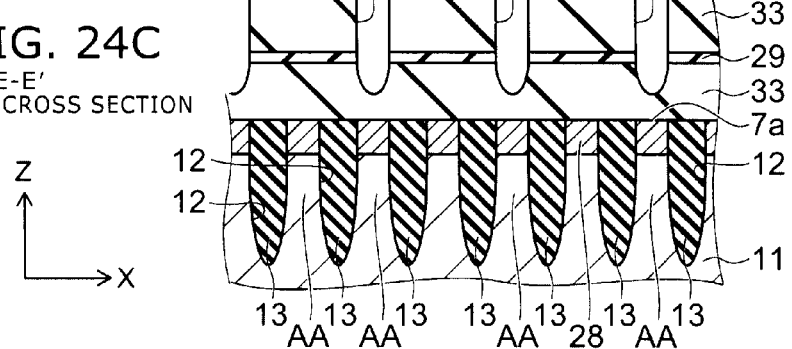

Continuing as illustrated in FIGS. 24A to 24C, multiple contact holes 34 are made in the inter-layer insulating film 33. The contact holes 34 are made in the regions directly above the active areas AA. At this time, for the regions directly above two mutually-adjacent active areas AA, the contact hole 34 is made in the region directly above the side surface 7b of one Y-direction side of the two side surfaces 7b of the recess 7 for one of the active areas AA; and the contact hole 34 is made in the region directly above the side surface 7b of the other Y-direction side of the two side surfaces 7b of the recess 7 for the other active area AA. In other words, the contact holes 34 made in the regions directly above the two mutually-adjacent active areas AA are made in regions having mutually different Y-direction positions. Thereby, the multiple contact holes 34 are arranged in a staggered configuration as viewed from the Z direction.

Each of the contact holes 34 reaches the side surface 7b of the recess 7 but does not reach the bottom surface 7a. A straight line formed by extending the central axis of the contact hole 34 intersects the bottom surface 7a. Because the contact hole 34 pierces the silicon nitride film 29 when making the contact hole 34, the silicon nitride film 29 can be utilized as an etching stopper film.

Then, as illustrated in FIG. 9 to FIG. 11, the bit line contact CB is formed by filling a conductive material, e.g., tungsten, into the contact hole 34. Then, the multiple bit lines BL are formed on the inter-layer insulating film 33. The bit line BL is formed extending in the Y direction in the region directly above the active area AA and is connected to the bit line contact CB. Then, the inter-layer insulating film 35 is formed on the inter-layer insulating film 33 by depositing an insulating material such as silicon oxide to bury the bit line BL. Subsequently, the silicon wafer is cut into the silicon substrates 11 by dicing. Thus, the semiconductor memory device 101 according to the embodiment is manufactured.

In the embodiment as well, similarly to the first embodiment described above, in the bit line contact region Rbc, the shortest distance between the active area AA and the bit line contact CB can be lengthened by making the recess 7 in the upper surface 6 of the active area AA, by the bit line contact CB contacting the side surface 7b of the recess 7, and by the bit line contact CB not contacting the bottom surface 7a. Thereby, the short margin between the bit line contact CB and the active area AA can be ensured without making the bit line contact CB finer even in the case where the arrangement period of the active area AA is made shorter. The contact resistance can be reduced because the diameter of the bit line contact CB can be increased. The patterning can be less difficult because the alignment margin of the lithography process can be ensured and the reduction of the diameter of the bit line contact CB can be suppressed. As a result, the yield of the device 101 increases.

Although the recess 7 is made in the active area AA by performing etching using the resist mask 25 as a mask in the processes illustrated in FIGS. 17A to 17C in the embodiment, at this time, it is sufficient to make only one opening 25a in a band configuration for each of the bit line contact regions in the resist mask 25. Therefore, the photolithography of the resist mask 25 is easy. Otherwise, the operational effects of the embodiment are similar to those of the first embodiment described above.

A seventh embodiment will now be described.

The embodiment is an embodiment in which the method for manufacturing the semiconductor memory device according to the second embodiment described above is illustrated specifically.

Figure 25A:
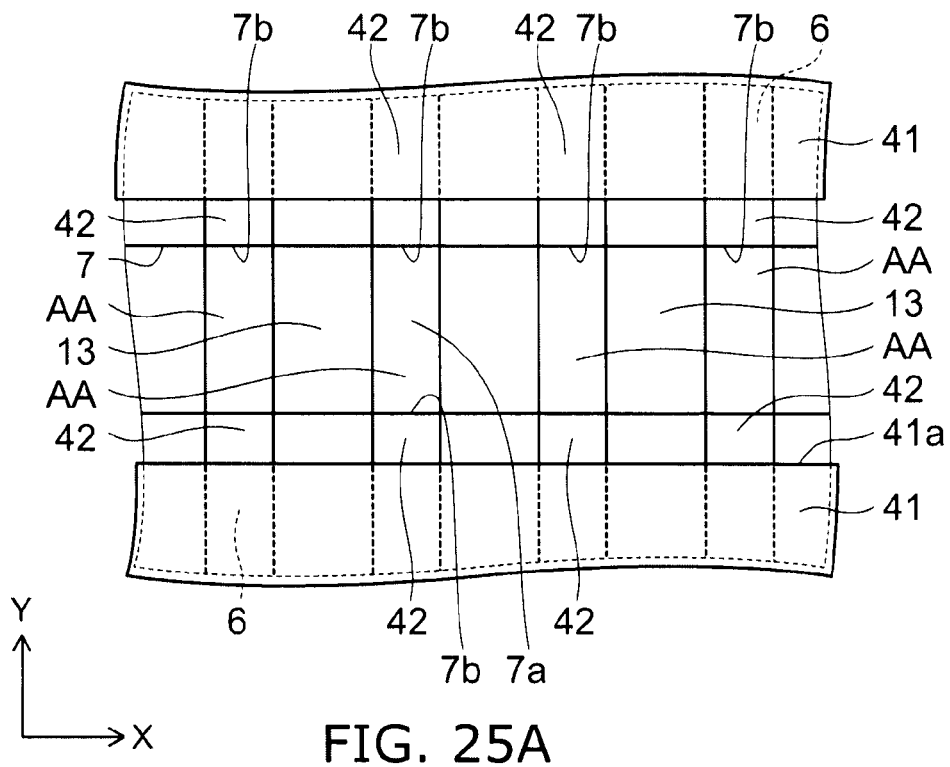
FIGS. 25A and 25B are process plan views illustrating a method for manufacturing a semiconductor memory device according to a seventh embodiment.
Figure 25B:
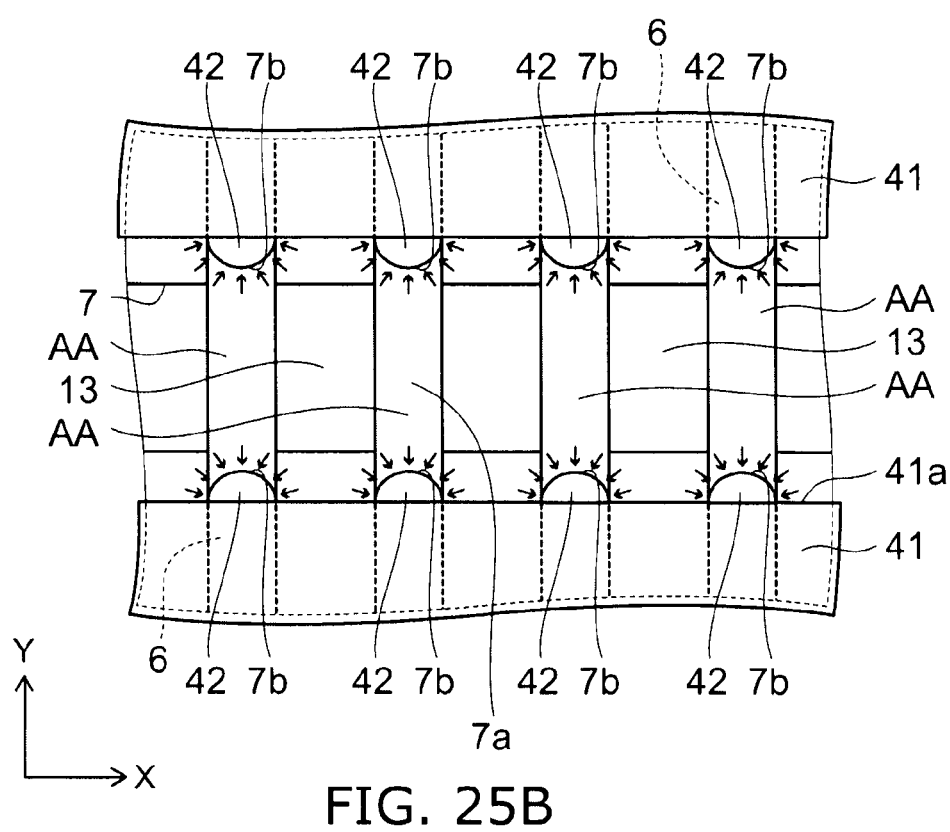

FIGS. 25A and 25B are process plan views illustrating the method for manufacturing the semiconductor memory device according to the embodiment.

First, the recess 7 is made in the upper surface of the active area AA by implementing the processes illustrated in FIG. 13A to FIG. 17C similarly to the sixth embodiment described above. Subsequently, the resist mask 25 is removed.

Then, as illustrated in FIG. 25A, a resist mask 41 is formed. An opening 41a is made in a band configuration in the resist mask 41 to extend in the X direction. At this time, the opening 41a of the resist mask 41 is made to be wider than the opening 25a of the resist mask 25 (referring to FIG. 17A) such that the region where the opening 25a is positioned is included in the interior of the opening 41a as viewed from the Z direction.

Thereby, the entire recess 7 of the active area AA and a portion 42 of the active area AA contacting the recess 7 are exposed inside the opening 41a. The exposed portion 42 is disposed on both Y-direction sides of the recess 7. At this time, the length of each of the portions 42 in the Y direction is not more than the width of the active area AA.

Continuing as illustrated in FIG. 25B, the STI 13 is caused to recede by performing selective isotropic etching on the STI 13 using the resist mask 41 as a mask. Subsequently, selective isotropic etching is performed on the active area AA. At this time, the corners of the portion 42 are rounded because the portion 42 is etched from both the X direction and the Y direction. Thereby, the side surface 7b has a curved surface curving into a protruding configuration; and the X-direction central portion of the side surface 7b protrudes more toward the interior of the recess 7 than do both X-direction end portions of the side surface 7b. Although the exposed portions of the STIs 13 also are etched to deform a certain amount, this is not illustrated in FIG. 25B.

Subsequently, the resist mask 41 is removed. Hereinafter, the processes are similar to those of the sixth embodiment described above. Namely, the processes illustrated in FIG. 18A to FIG. 24C and FIG. 8 to FIG. 11 are performed. Thereby, the semiconductor memory device according to the embodiment is manufactured.

An eighth embodiment will now be described.

The embodiment is an embodiment in which the method for manufacturing the semiconductor memory device according to the third embodiment described above is illustrated specifically.

Figure 26A:
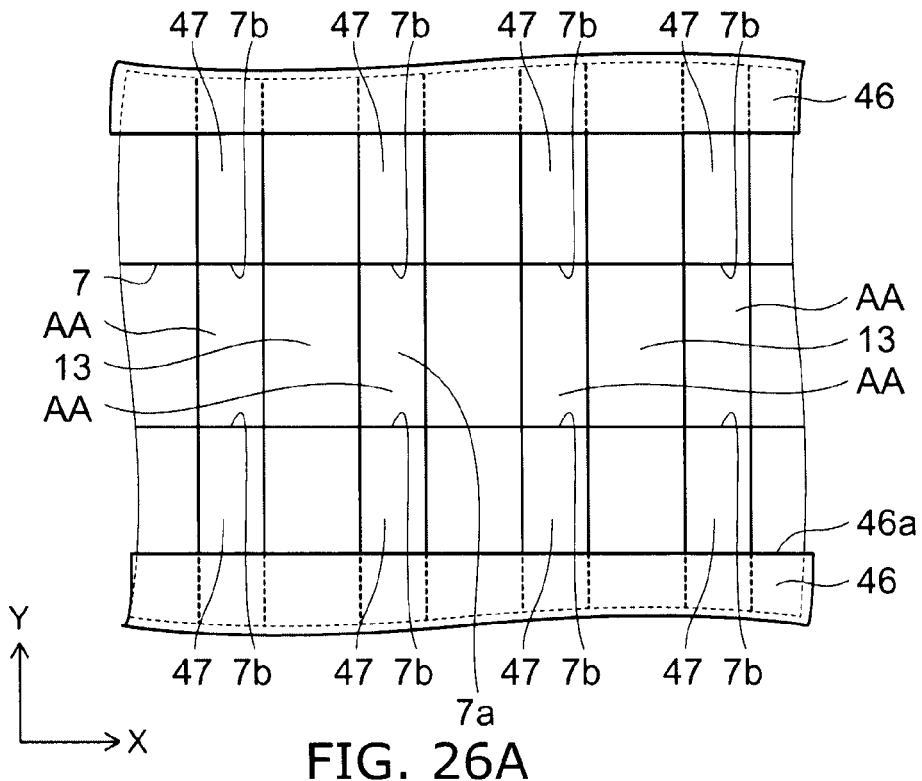
FIGS. 26A and 26B are process plan views illustrating a method for manufacturing a semiconductor memory device according to an eighth embodiment.
Figure 26B:
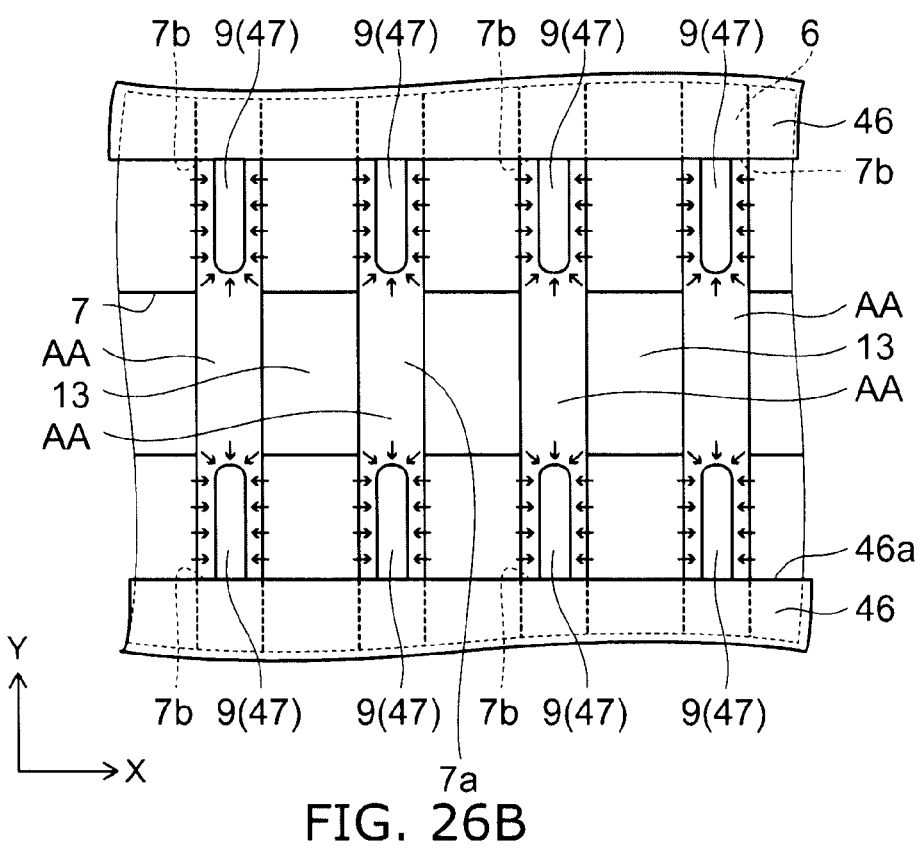

FIGS. 26A and 26B are process plan views illustrating the method for manufacturing the semiconductor memory device according to the embodiment.

First, similarly to the sixth embodiment described above, the recess 7 is made in the upper surface of the active area AA by implementing the processes illustrated in FIG. 13A to FIG. 17C. Subsequently, the resist mask 25 is removed.

Then, as illustrated in FIG. 26A, a resist mask 46 is formed. An opening 46a is made in a band configuration in the resist mask 46 to extend in the X direction. At this time, the opening 46a of the resist mask 46 is made to be wider than the opening 41a of the resist mask 41 of the seventh embodiment described above (referring to FIG. 25A) such that the region where the opening 41a is positioned is included in the interior of the opening 46a as viewed from the Z direction. Accordingly, in the processes illustrated in FIGS. 17A to 17C, the region where the opening 25a of the resist mask 25 is positioned also is included in the interior of the opening 46a. Thereby, the entire recess 7 and a portion 47 contacting the recess 7 of the active area AA and the STI 13 are exposed inside the opening 46a. At this time, the length of the exposed portion 47 in the Y direction is greater than the width of the active area AA.

Continuing as illustrated in FIG. 26B, the etching is performed using the resist mask 46 as a mask. At this time, the corners of the portion 47 are rounded because the portion 47 is etched from both the X direction and the Y direction. Also, because the side surfaces of the portion 47 facing the X direction are etched mainly from the X direction, the width of the portion 47, i.e., the length in the X direction, becomes smaller. Thereby, the protruding portion 9 is formed in the X-direction central portion of the side surface 7b of the recess 7 to protrude toward the interior of the recess 7, where the protruding portion 9 has a width narrower than the width of the active area AA. Although the exposed portions of the STIs 13 also are etched to deform a certain amount, this is not illustrated in FIG. 26B.

Subsequently, the resist mask 46 is removed. Hereinafter, the processes are similar to those of the sixth embodiment described above. Namely, the processes illustrated in FIG. 18A to FIG. 24C and FIG. 8 to FIG. 11 are performed. Thereby, the semiconductor memory device according to the embodiment is manufactured.

However, the configurations of the semiconductor memory devices according to the seventh and eighth embodiments are realizable also without employing an etching process that uses the resist mask 41 by making the recess 7 by anisotropic etching that uses the resist mask 25 as a mask, subsequently causing the STI 13 to recede by selectively performing isotropic etching with the resist mask 25 left as-is, and by subsequently performing selective isotropic etching of the active area AA.

A ninth embodiment will now be described.

The embodiment is an embodiment in which the method for manufacturing the semiconductor memory device according to the fourth embodiment described above is illustrated specifically.

Figure 27A:
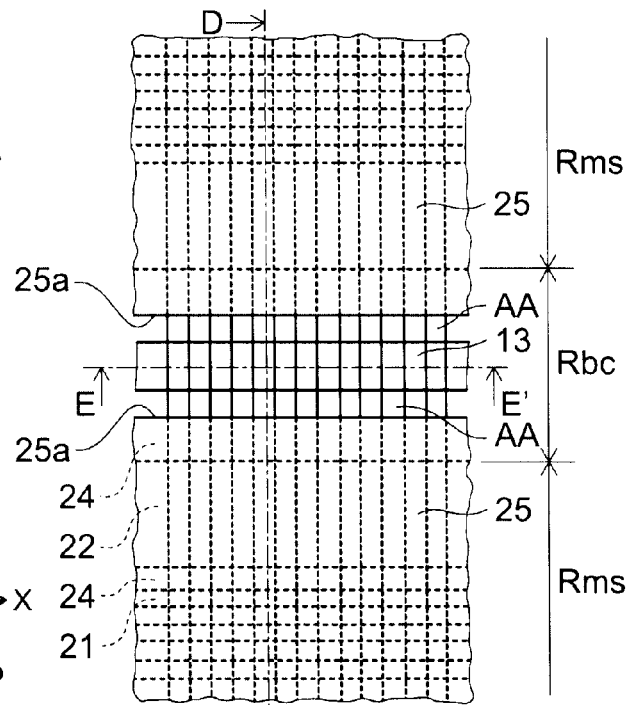
FIGS. 27A to 27C are process views illustrating a method for manufacturing a semiconductor memory device according to a ninth embodiment.
Figure 27B:
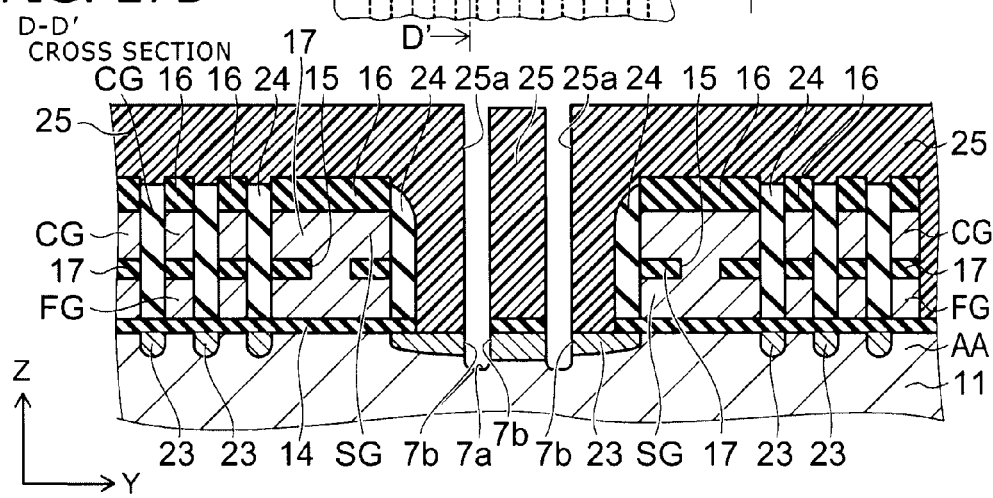
Figure 27C:
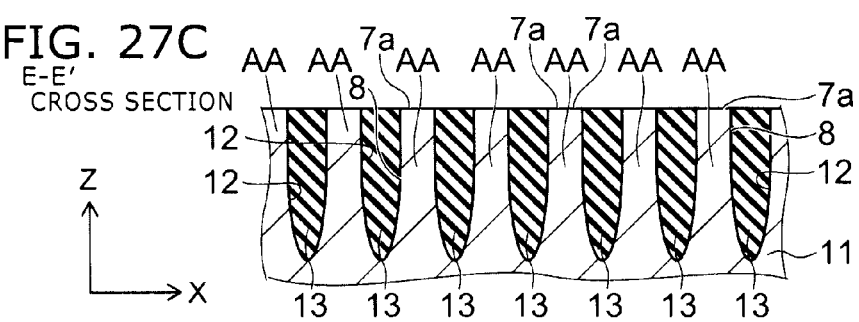

FIGS. 27A to 27C illustrate the method for manufacturing the semiconductor memory device according to the embodiment. FIG. 27A is a process plan view; FIG. 27B is a process cross-sectional view along line D-D' of FIG. 27A; and FIG. 27C is a process cross-sectional view along line E-E' of FIG. 27A.

First, the processes illustrated in FIG. 13A to FIG. 15C are implemented similarly to the sixth embodiment described above.

Then, as illustrated in FIGS. 27A to 27C, the resist mask 25 is formed. At this time, although the opening 25a is made in a band configuration in one location in each of the bit line contact regions Rbc to extend in the X direction in the sixth embodiment described above, in the embodiment, the opening 25a is made in two mutually-different Y-direction locations in each of the bit line contact regions Rbc. The width of each of the openings 25a is finer than that of the sixth embodiment described above. Then, anisotropic etching is performed using the resist mask 25 as a mask. Thereby, the recess 7 is made in two mutually-separated regions of the upper surface of each of the active areas AA in each of the bit line contact regions Rbc.

Continuing, the processes illustrated in FIG. 18A to FIG. 23C are implemented similarly to the sixth embodiment described above.

Then, as illustrated in FIG. 24A, the contact holes 34 are made in a staggered configuration in the inter-layer insulating film 33. At this time, two of the contact holes 34 that reach two mutually-adjacent active areas AA are formed in regions directly above the recesses 7 having mutually different Y-direction positions. Then, each of the contact holes 34 reaches both of the two side surfaces 7b of each of the recesses 7 but does not reach the bottom surface 7a.

Hereinafter, the processes are similar to those of the sixth embodiment described above. Thereby, the semiconductor memory device according to the embodiment is manufactured.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

Although an example is illustrated in the embodiments described above in which, for example, the side surface 7b of the recess 7 is tilted to face upward, the invention is not limited thereto. The side surface 7b may be perpendicular and may have a reverse-tapered configuration, that is, may be tilted to face downward. The configuration of the bit line contact CB is not limited to the being elliptical and diamond-shaped as viewed from the Z direction. The embodiments described above can be implemented in combination with each other.

According to the embodiments described above, a semiconductor memory device that can ensure the short margin between the contact and the active area and a method for manufacturing the same can be realized.

What is claimed is:

1. A semiconductor memory device, comprising:
   a semiconductor substrate;
   a plurality of element-separating insulators formed in an upper layer portion of the semiconductor substrate, the plurality of element-separating insulators partitioning the upper layer portion into a plurality of active areas of the semiconductor substrate extending in a first direction;
   contacts physically connected to the active areas respectively; and
   a recess formed in a part, in the first direction, of an upper surface of each of the active areas, the recess being made across the entire active area in a second direction orthogonal to the first direction,
   positions in the first direction, of two of the contacts being connected respectively to mutually-adjacent active areas, being different from each other, and
   one of the contacts being in physical contact with a side surface of the recess and having a bottom surface not in physical contact with the active area.

2. The device according to claim 1, wherein a length of the one of the contacts in the first direction is longer than a length of the one of the contacts in the second direction.

3. The device according to claim 1, wherein a length of a first-direction central portion of the one of the contacts in the second direction is longer than lengths of both first-direction end portions of the one of the contacts in the second direction.

4. The device according to claim 1, wherein a straight line formed by extending a central axis of the one of the contacts intersects the bottom surface of the recess.

5. The device according to claim 1, wherein a length of the one of the contacts in the second direction in a plane including a lower end of a contact surface between the one of the contacts and the active area is shorter than a length of the one of the contacts in the second direction in a plane including an upper end of the contact surface between the one of the contacts and the active area, the plane including the lower end and the plane including the upper end are parallel to the first direction and the second direction.

6. The device according to claim 1, wherein:
   each of the active areas has one of the recesses having two side surfaces opposing each other in the first direction;
   one of the two contacts is in contact with one of two side surfaces; and
   the other of the two contacts is in contact with the other of the two side surfaces.

7. The device according to claim 1, wherein
   each of the active areas has a plurality of the recesses, and
   one of the contacts is in contact with both of two side surfaces of the recess opposing each other in the first direction.

8. The device according to claim 1, wherein a curvature radius of a corner between a side surface of the active area facing the second direction and the bottom surface of the recess is larger than a curvature radius of a corner between the side surface of the active area facing the second direction and the upper surface of the active area.

9. The device according to claim 1, wherein the side surface of the recess is curved to be convex toward an interior of the recess.

10. The device according to claim 1, wherein a protruding portion protruding toward an interior of the recess is formed in a second-direction central portion of the side surface of the recess, and a width of the protruding portion is smaller than a width of the active area.

* * * * *